US009379339B2

(12) United States Patent
Inoue

(10) Patent No.: US 9,379,339 B2
(45) Date of Patent: Jun. 28, 2016

(54) SUBSTRATE CARTRIDGE, SUBSTRATE-PROCESSING APPARATUS, SUBSTRATE-PROCESSING SYSTEM, SUBSTRATE-PROCESSING METHOD, CONTROL APPARATUS, AND METHOD OF MANUFACTURING DISPLAY ELEMENT

(75) Inventor: Hideya Inoue, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 894 days.

(21) Appl. No.: 13/461,523

(22) Filed: May 1, 2012

(65) Prior Publication Data

US 2012/0215338 A1    Aug. 23, 2012

Related U.S. Application Data

(63) Continuation of application No. PCT/JP2010/069684, filed on Nov. 5, 2010.

(30) Foreign Application Priority Data

Nov. 5, 2009  (JP) ................................. P2009-253975
Nov. 5, 2009  (JP) ................................. P2009-253976

(51) Int. Cl.
| B65D 85/00 | (2006.01) |
| B65D 25/38 | (2006.01) |
| B65G 49/00 | (2006.01) |
| G06F 19/00 | (2011.01) |
| H05K 13/00 | (2006.01) |
| H01L 51/00 | (2006.01) |
| H01L 27/32 | (2006.01) |

(52) U.S. Cl.
CPC .......... *H01L 51/0096* (2013.01); *H01L 27/3244* (2013.01); *Y02E 10/549* (2013.01); *Y10T 29/49002* (2015.01)

(58) Field of Classification Search
CPC ............ H01L 27/3244; H01L 51/0096; Y10T 29/49002; Y02E 10/549
See application file for complete search history.

(56) References Cited

U.S. PATENT DOCUMENTS

| 4,954,319 | A |   | 9/1990  | Koizumi et al. |            |
| 5,844,803 | A | * | 12/1998 | Beffa          | 700/121    |
| 5,856,923 | A | * | 1/1999  | Jones et al.   | 700/121    |
| 6,078,845 | A | * | 6/2000  | Friedman       | 700/104    |

(Continued)

FOREIGN PATENT DOCUMENTS

| CN | 102549713 A | 7/2012 |
| EP | 0 456 388 A1 | 11/1991 |

(Continued)

OTHER PUBLICATIONS

Notice of Reasons for Rejection, mailed Nov. 19, 2013, from Japanese Patent Office in related Japanese patent application No. 2009-253976 ( 4 pages).

(Continued)

*Primary Examiner* — Ramesh Patel
(74) *Attorney, Agent, or Firm* — Finnegan, Henderson, Farabow, Garrett & Dunner, L.L.P.

(57) ABSTRACT

A substrate cartridge includes a cartridge main body that houses a substrate and an information-maintaining section that is housed in the cartridge main body and maintains information that includes at least specification information of specification values of the substrate housed in the cartridge main body.

67 Claims, 24 Drawing Sheets

(56) References Cited

U.S. PATENT DOCUMENTS

| | | | |
|---|---|---|---|
| 6,259,960 B1* | 7/2001 | Inokuchi | 700/110 |
| 6,263,255 B1* | 7/2001 | Tan et al. | 700/121 |
| 6,993,405 B2* | 1/2006 | Beaulieu et al. | 700/116 |
| 7,233,830 B1* | 6/2007 | Callaghan et al. | 700/9 |
| 7,613,528 B2* | 11/2009 | Shirota | 700/19 |
| 7,613,535 B2* | 11/2009 | Jann et al. | 700/96 |
| 7,643,897 B2* | 1/2010 | Kang | 700/114 |
| 7,668,615 B2* | 2/2010 | Goff et al. | 700/101 |
| 7,676,294 B2* | 3/2010 | Baier et al. | 700/108 |
| 7,729,793 B2* | 6/2010 | Zwicker | 700/114 |
| 7,970,484 B2* | 6/2011 | Fontanot | 700/115 |
| 7,983,778 B2* | 7/2011 | Qu | 700/101 |
| 8,010,220 B1* | 8/2011 | Ames et al. | 700/119 |
| 8,190,279 B2* | 5/2012 | Clark | 700/96 |
| 8,260,447 B2* | 9/2012 | Mattes et al. | 700/118 |
| 8,271,119 B2* | 9/2012 | Nakagawa | 700/117 |
| 8,280,543 B2* | 10/2012 | Grau et al. | 700/112 |
| 8,335,575 B2* | 12/2012 | Papenfort et al. | 700/23 |
| 8,996,186 B2* | 3/2015 | Chen et al. | 700/291 |
| 2006/0207916 A1 | 9/2006 | Mimura et al. | |
| 2006/0223340 A1 | 10/2006 | Yoneda | |
| 2008/0213621 A1 | 9/2008 | Takashima et al. | |

FOREIGN PATENT DOCUMENTS

| | | |
|---|---|---|
| EP | 1 601 013 A1 | 11/2005 |
| JP | 62-123735 | 6/1987 |
| JP | 1-158360 | 6/1989 |
| JP | 3-138958 | 6/1991 |
| JP | 04-219805 | 8/1992 |
| JP | A-04-219805 | 8/1992 |
| JP | 04-322954 | 11/1992 |
| JP | 07-079093 | 3/1995 |
| JP | 8-293540 | 11/1996 |
| JP | 2000-303178 | 10/2000 |
| JP | 2003-100843 | 4/2003 |
| JP | 2006-286966 | 10/2006 |
| JP | 2009-105275 | 5/2009 |
| JP | A-2011-070868 | 4/2011 |
| TW | 200417501 A | 9/2004 |
| WO | WO 2004/079818 A1 | 9/2004 |
| WO | WO 2006/100868 A1 | 9/2006 |
| WO | WO 2011-037273 A1 | 3/2011 |

OTHER PUBLICATIONS

Notice of Reasons for Rejection, mailed Nov. 19, 2013, from Japanese Patent Office in related Japanese patent application No. 2009-253975 (5 pages).

Notice of Reasons for Rejection, mailed Jun. 11, 2013, from Japanese Patent Office in related Japanese patent application No. 2009-253975 (5 pages).

Notice of Reasons for Rejection, mailed Jun. 11, 2013, from Japanese Patent Office in related Japanese patent application No. 2009-253976 (5 pages).

Notice of Reasons for Rejection issued by the Japanese Patent Office in Japanese Application No. 2009-253976, mailed Mar. 11, 2014 (10 pages).

Notice of Reasons for Rejection issued by the Japanese Patent Office in Japanese Application No. 2009-253975, mailed Mar. 11, 2014 (10 pages).

International Search Report, from the Japanese Patent Office in corresponding PCT Application No. PCT/JP2010/069684, mailed Dec. 28, 2010.

Written Opinion of the International Searching Authority in corresponding International Application No. PCT/JP2010/069684, mailed Dec. 28, 2010.

Office Action from the State Intellectual Property Office of People's Republic of China referencing Application No. 201080048076.1, 23 pages, dated Dec. 16, 2014.

Office Action from the State Intellectual Property Office of People's Republic of China referencing Application No. 201080048076.1, 22 pages, dated May 5, 2014.

Office Action issued by the Taiwan Intellectual Property Office in Taiwanese Patent Application No. 099137889 on Nov. 10, 2015, and English translation thereof.

* cited by examiner

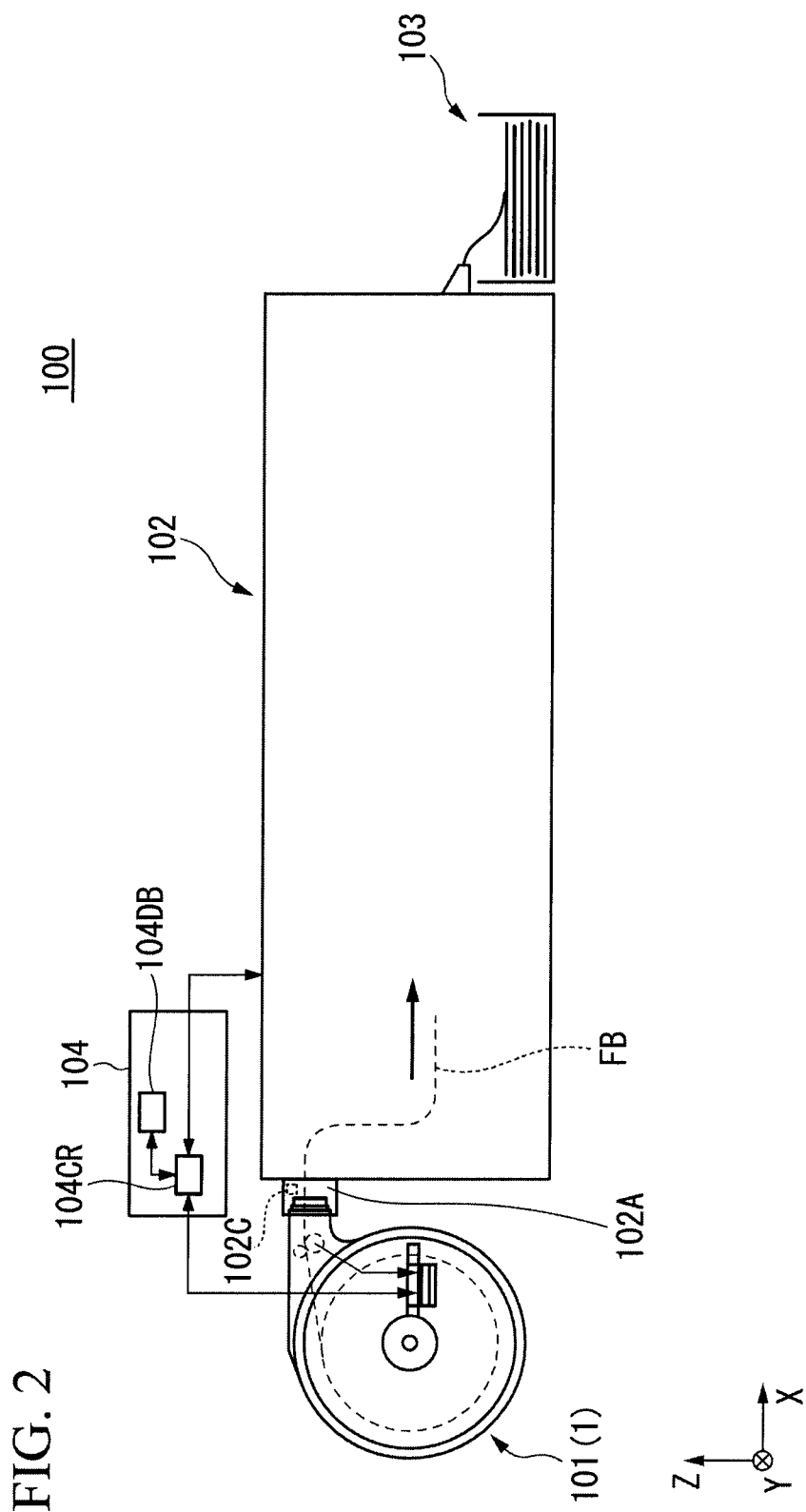

| IDENTIFICATION INFORMATION | SPECIFICATION VALUE | | | | PROCESS ID |
|---|---|---|---|---|---|
| N1 | M1 | F1 | HR1 | ... | ID1 |
| N2 | M1 | F2 | HR1 | ... | ID2 |
| N3 | M2 | F1 | HR2 | ... | ID3 |
| ⋮ | ⋮ | ⋮ | ⋮ | ⋮ | ⋮ |

| PROCESS ID | COMBINATION OF UNIT PROCESSES | | | | |
|---|---|---|---|---|---|
| ID1 | A1 | B3 | C2 | D3 | ... |
| ID2 | A2 | B1 | C3 | D2 | ... |
| ID3 | A1 | B2 | C1 | D1 | ... |
| ⋮ | ⋮ | ⋮ | ⋮ | ⋮ | ⋮ |

FIG. 31

| IDENTIFICATION INFORMATION (ID) | SHEET NO. | POSITIONAL INFORMATION | TYPE OF DEFECT | DEGREE OF DEFECT | RECOVERY STATE | PROGRESS INFORMATION | FORM INFORMATION | SHAPE INFORMATION |
|---|---|---|---|---|---|---|---|---|
| A | 1 | X1,Y1 | 1 | 2 | 1 | P1 | | |
| B | 2 | X2,Y2 | 0 | 0 | 1 | P1 | | |
| C | 5 | X3,Y3 | 2 | 5 | 0 | P3 | | |
| D | 11 | X4,Y4 | 1 | 3 | 0 | P2 | | |
| E | 7 | X5,Y5 | 0 | 0 | 1 | P1 | | |
| A | 1 | X6,Y6 | | | | P1 | F1 | |
| A | 1 | X7,Y7 | | | | P1 | | S1 |
| B | 2 | X8,Y8 | | | | P1 | F2 | |
| ... | | | | | | | | |

SUBSTRATE CARTRIDGE, SUBSTRATE-PROCESSING APPARATUS, SUBSTRATE-PROCESSING SYSTEM, SUBSTRATE-PROCESSING METHOD, CONTROL APPARATUS, AND METHOD OF MANUFACTURING DISPLAY ELEMENT

CROSS-REFERENCE TO RELATED APPLICATION

This is a Continuation Application of International Application No. PCT/JP2010/069684, filed Nov. 5, 2010, which claims priority to Japanese Patent Application Nos. 2009-253975 and 2009-253976, filed on Nov. 5, 2009. The contents of the aforementioned applications are incorporated herein by reference.

BACKGROUND

1. Field of the Invention

The present invention relates to a substrate cartridge, a substrate-processing apparatus, a substrate-processing system, a substrate-processing method, a control apparatus, and a method of manufacturing a display element.

2. Description of Related Art

As display elements configuring display devices such as display apparatuses, for example, organic electroluminescence (organic EL) elements are known. The organic EL element has a configuration in which an anode and a cathode are formed on a substrate, and an organic light-emitting layer interposed between the anode and the cathode is included. In the organic EL element, holes are injected to the organic light-emitting layer from the anode, holes and electrons are combined together in the organic light-emitting layer, and display light is acquired in accordance with emitted light at the time of the combing thereof. In the organic EL element, for example, an electric circuit connected to the anode and the cathode and the like are formed on the substrate.

As one of techniques for manufacturing an organic EL element, for example, a technique called a roll-to-roll method (hereinafter, simply referred to as a "roll method") is known (for example, see PCT Publication No. 2006/100868). The roll method is a technique in which one sheet-shaped substrate wound around a roller located on the substrate-supplying side is sent out, the substrate is conveyed while the sent-out substrate is wound around a roller located on the substrate-recovering side, and a light-emitting layer, an anode, a cathode, an electric circuit, and the like that configures an organic EL element are sequentially formed on the substrate by a processing device until the substrate is wound after being sent off.

In the configuration disclosed in PCT Publication No. 2006/100868, for example, a roller used for sending out the substrate and a roller used for winding the substrate are configured so as to be detachable from the processing device. The detached rollers, for example, are conveyed to another processing device and can be installed to another processing device so as to be used.

SUMMARY

However, in the configuration that can be detachably attached to the processing device as described above, for example, it is difficult to determine what kind of substrate is wound around the roller. In addition, for example, it is difficult to determine a stage up to which the substrate wound around the roller has been processed. Accordingly, an operation of checking a substrate by using certain means each time the roller is installed is necessary, which requires labor.

The object of the aspects of the present invention is to provide, a substrate cartridge, a substrate-processing apparatus, a substrate-processing system, a substrate-processing method, a control apparatus, and a method of manufacturing a display element, which can perform efficient processing of a substrate.

According to a first aspect of the present invention, there is provided a substrate cartridge including: a cartridge main body that houses a substrate; and an information-maintaining section that maintains information including at least specification information relating to a specification value of the substrate that is housed in the cartridge main body.

According to a second aspect of the present invention, there is provided a substrate cartridge including: a cartridge main body that houses a substrate; and an information-maintaining section that maintains information including at least process information that is based on specification information relating to a specification value of the substrate that is housed in the cartridge main body.

According to a third aspect of the present invention, there is provided a substrate-processing apparatus including: a substrate-processing unit that processes a substrate; a substrate carrying-in unit that carries the substrate in the substrate-processing unit; and a substrate carrying-out unit that carries the substrate out from the substrate-processing unit, wherein the substrate cartridge according to the present invention is used as at least one of the substrate carrying-in unit and the substrate carrying-out unit.

According to a fourth aspect of the present invention, there is provided a substrate-processing system including: a substrate-processing apparatus that processes a substrate; the substrate cartridge according to the present invention that is connected to the substrate-processing apparatus; and a main control apparatus that receives the information from the information-maintaining section of the substrate cartridge and controls the substrate-processing apparatus based on the information.

According to a fifth aspect of the present invention, there is provided a substrate-processing method in which a substrate is processed while the substrate is supplied, and the substrate is recovered after the process, the substrate-processing method including: performing at least one of supply or recovery of the substrate by using the substrate cartridge according to the present invention; and processing the substrate by using the information that is acquired through the substrate cartridge.

According to a sixth aspect of the present invention, there is provided a control apparatus including a main control unit that controls both of a substrate-processing apparatus which processes a substrate and the substrate cartridge according to the present invention which is connected to the substrate-processing apparatus.

According to a seventh aspect of the present invention, there is provided a method of manufacturing a display element, the method including: processing a substrate by using a substrate-processing unit; and performing supply of the substrate to the substrate-processing unit or recovery of the substrate from the substrate-processing unit by using the substrate cartridge according to the present invention.

According to an eighth aspect of the present invention, there is provided a substrate cartridge including: a cartridge main body that houses a substrate; and an information-maintaining section that maintains at least one of identification information used for identifying the cartridge main body and process information of the substrate that is housed in the cartridge main body.

According to a ninth aspect of the present invention, there is provided a substrate-processing apparatus including: a substrate-processing unit that processes a substrate; a substrate carrying-in unit that carries the substrate in the substrate-processing unit; and a substrate carrying-out unit that carries the substrate out from the substrate-processing unit, wherein the substrate cartridge according to the present invention is used as at least one of the substrate carrying-in unit and the substrate carrying-out unit.

According to a tenth aspect of the present invention, there is provided a substrate-processing system including: a substrate-processing apparatus that processes a substrate; the substrate cartridge according to the present invention that is connected to the substrate-processing apparatus; and a main control unit that receives the information from the information-maintaining section of the substrate cartridge and controls the substrate-processing apparatus based on the information.

According to an eleventh aspect of the present invention, there is provided a substrate-processing method in which a substrate is processed while the substrate is supplied, and the substrate is recovered after the process, the substrate-processing method including: performing at least one of supply or recovery of the substrate by using the substrate cartridge according to the present invention; and processing the substrate by using information that is acquired through the substrate cartridge.

According to a twelfth aspect of the present invention, there is provided a control apparatus including a main control unit that controls both of a substrate-processing apparatus which processes a substrate and the substrate cartridge according to the present invention which is connected to the substrate-processing apparatus.

According to a thirteenth aspect of the present invention, there is provided a method of manufacturing a display element, the method including: processing a substrate by using a substrate-processing unit; and performing supply of the substrate to the substrate-processing unit or recovery of the substrate from the substrate-processing unit by using the substrate cartridge according to the present invention.

According to the aspects of the present invention, it is possible to perform efficient processing of a substrate.

BRIEF DESCRIPTION OF THE DRAWINGS

FIG. 2 is a diagram illustrating the configuration of a substrate-processing apparatus according to the embodiment.

FIG. 7A is a diagram illustrating the configuration of a control section according to the embodiment.

FIG. 7B is a diagram illustrating the configuration of the control section according to the embodiment.

FIG. 31 is a diagram illustrating an example of process information according to the embodiment.

DESCRIPTION OF EMBODIMENTS

Hereinafter, a first embodiment of the present invention will be described with reference to the drawings.

(Organic EL Element)

Figure 1A:
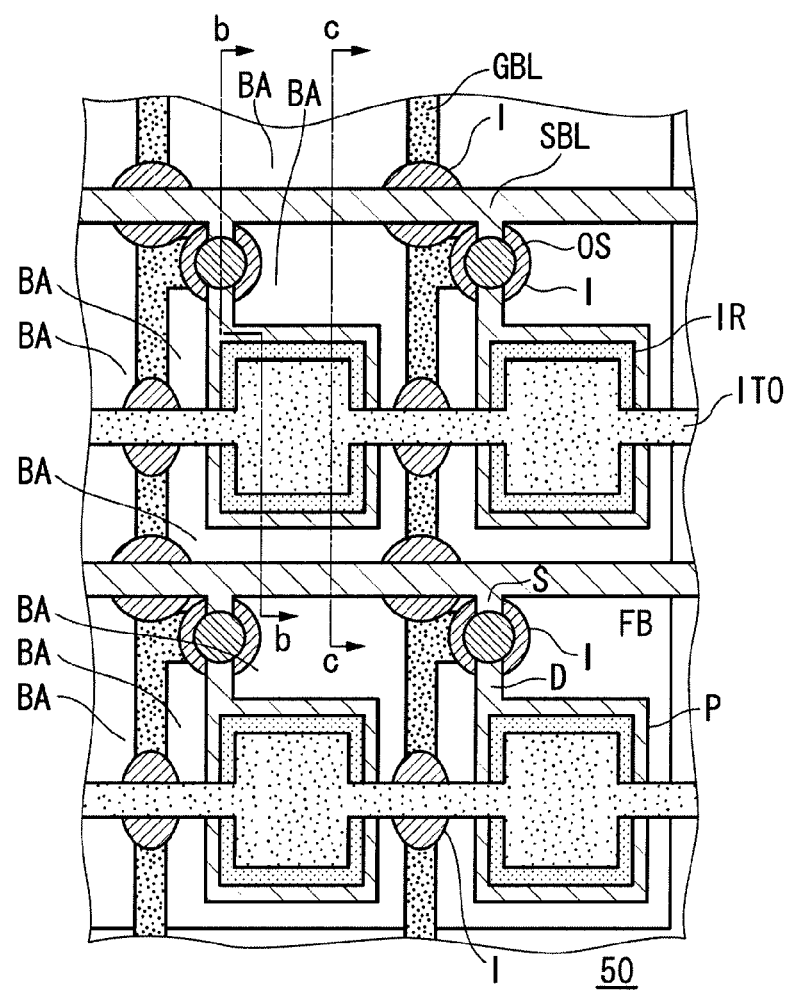
FIG. 1A is a configuration diagram of an organic EL element according to a first embodiment of the present invention.
Figure 1B:
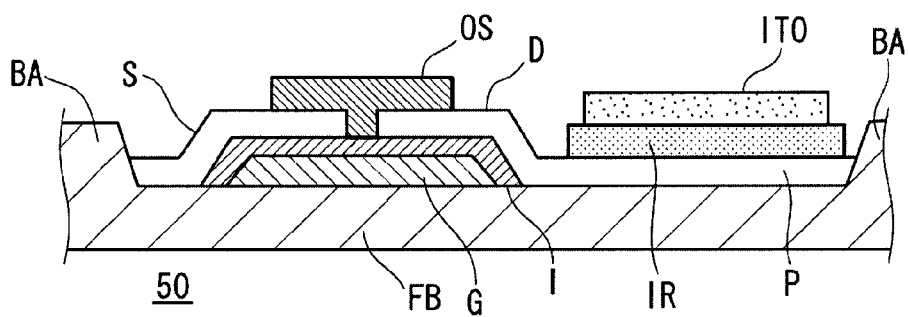
FIG. 1B is a cross-sectional view of the organic EL element according to the first embodiment of the present invention.
Figure 1C:
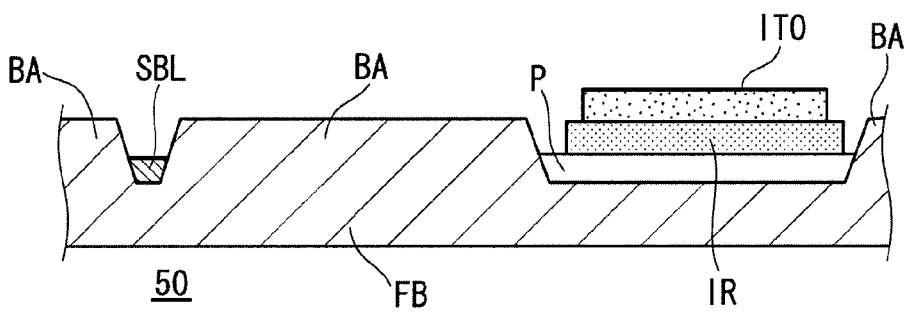
FIG. 1C is a cross-sectional view of the organic EL element according to the first embodiment of the present invention.

FIG. 1A is a plan view illustrating the configuration of an organic EL element. FIG. 1B is a cross-sectional view taken along line b-b shown in FIG. 1A. FIG. 1C is a cross-sectional view taken along line c-c shown in FIG. 1A.

As illustrated in FIGS. 1A to 1C, the organic EL element 50 is a bottom contact type in which a gate electrode G and a gate-insulating layer I are formed on a sheet substrate FB, a source electrode S, a drain electrode D, and a pixel electrode P are further formed, and then, an organic semiconductor layer OS is formed.

As illustrated in FIG. 1B, the gate-insulating layer I is formed on the gate electrode G. On the gate-insulating layer I, a source electrode S of a source bus line SBL is formed, and the drain electrode D that is connected to the pixel electrode P is formed. The organic semiconductor layer OS is formed between the source electrode S and the drain electrode D. Accordingly, a field-effect transistor is completed. In addition, on the pixel electrode P, as illustrated in FIGS. 1B and 1C, a light-emitting layer IR is formed, and a transparent electrode ITO is formed on the light-emitting layer IR.

As illustrated in FIGS. 1B and 1C, for example, partition walls BA (bank layer) are formed on the sheet substrate FB. In addition, as illustrated in FIG. 1C, the source bus line SBL is formed between the partition walls BA. As above, since the partition walls BA are present, the source bus line SBL is formed with high precision, and the pixel electrode P and the light-emitting layer IR are correctly formed. Although not illustrated in FIGS. 1B and 1C, a gate bus line GBL is formed between the partition walls BA, similarly to the source bus line SBL.

This organic EL element 50 is appropriately used not only in a display apparatus such as a display device but also a display unit of an electronic apparatus or the like. In such a case, for example, the organic EL element 50 formed in a panel state is used. In manufacturing such an organic EL element 50, a substrate needs to be formed in which thin film transistors (TFTs) and pixel electrodes are formed. In order to form one or more organic compound layers (light-emitting element layers) including the light-emitting layer on the pixel electrodes formed on the substrate with high precision, it is preferable that the partition walls BA (bank layer) be easily formed in boundary areas of the pixel electrodes with high precision.

(Substrate-Processing Apparatus)

FIG. 2 is a schematic diagram illustrating the configuration of a substrate-processing apparatus 100 that performs processing by using a sheet substrate FB having flexibility.

The substrate-processing apparatus 100 is an apparatus that forms the organic EL element 50 illustrated in FIG. 1 by using a band-shaped sheet substrate FB. As illustrated in FIG. 2, the substrate-processing apparatus 100 includes a substrate-supplying unit 101, a substrate-processing unit 102, a substrate-recovering unit 103, and a control section 104. The sheet substrate FB is configured to be conveyed to the substrate-recovering unit 103 from the substrate-supplying unit 101 through the substrate-processing unit 102. The control section 104 controls the overall operation of the substrate-processing apparatus 100. In addition, the control section 104 includes a database 104DB that is a storage unit that stores information therein.

In the description presented below, an XYZ orthogonal coordinate system is set, and the positional relationship of each member will be described with reference to this XYZ orthogonal coordinate system. Within the horizontal plane, the conveying direction of the sheet substrate FB is set as the X axis direction, and a direction perpendicular to the X axis direction within the horizontal plane is set as the Y axis direction, and a direction (that is, the vertical direction) perpendicular to the X axis direction and the Y axis direction is set as the Z axis direction. In addition, the rotation (tilt) directions around the X axis, the Y axis, and the Z axis are denoted by θX, θY, and θZ directions.

As the sheet substrate FB, for example, a heat-resistant resin film, a stainless steel, or the like can be used. For example, as the material of the resin film, polyethylene resin, polypropylene resin, polyester resin, ethylene vinyl copolymer resin, polyvinylchloride resin, cellulosic resin, polyamide resin, polyimide resin, polycarbonate resin, polystyrene resin, polyvinyl acetate resin, or the like can be used. The size of the sheet substrate FB in the Y direction, for example, is set to about 1 m to 2 m, and the size in the X direction, for example, is formed to be equal to or more than 10 m. It is apparent that the sizes are merely an example, and the embodiment is not limited thereto. For example, the size of the sheet substrate FB in the Y direction may be equal to or less than 50 cm or may be equal to or more than 2 m. In addition, the size of the sheet substrate FB in the X direction may be equal to or less than 10 m. In this embodiment, the flexibility represents a property of no shearing or no fracturing, for example, in a case where at least a predetermined force that is about the same level as that of the weight thereof is applied to the substrate and capable of bending the substrate. In addition, for example, a property of being bent in accordance with the predetermined force is included in the flexibility. In addition, the flexibility changes in accordance with the material, the size, the thickness of the substrate, the environment such as the temperature, or the like. As the sheet substrate FB, although one band-shaped substrate may be used, a configuration may be employed which is formed in a band shape by connecting a plurality of unit substrates together.

It is preferable that the sheet substrate FB have a low thermal expansion coefficient such that the size thereof does not change, for example, even when the sheet substrate FB receives heat of about 200° C. For example, the thermal expansion coefficient may be lowered by mixing inorganic filler into the resin film. As examples of the inorganic filler, there are titanium oxide, zinc oxide, alumina, and silicon oxide.

The substrate-supplying unit 101 is connected to a supply-side connection portion 102A that is disposed in the substrate-processing unit 102. The substrate-supplying unit 101 supplies the sheet substrate FB, for example, wound in a roll shape to the substrate-processing unit 102. The substrate-recovering unit 103 recovers the sheet substrate FB that has been processed by the substrate-processing unit 102.

Figure 3:
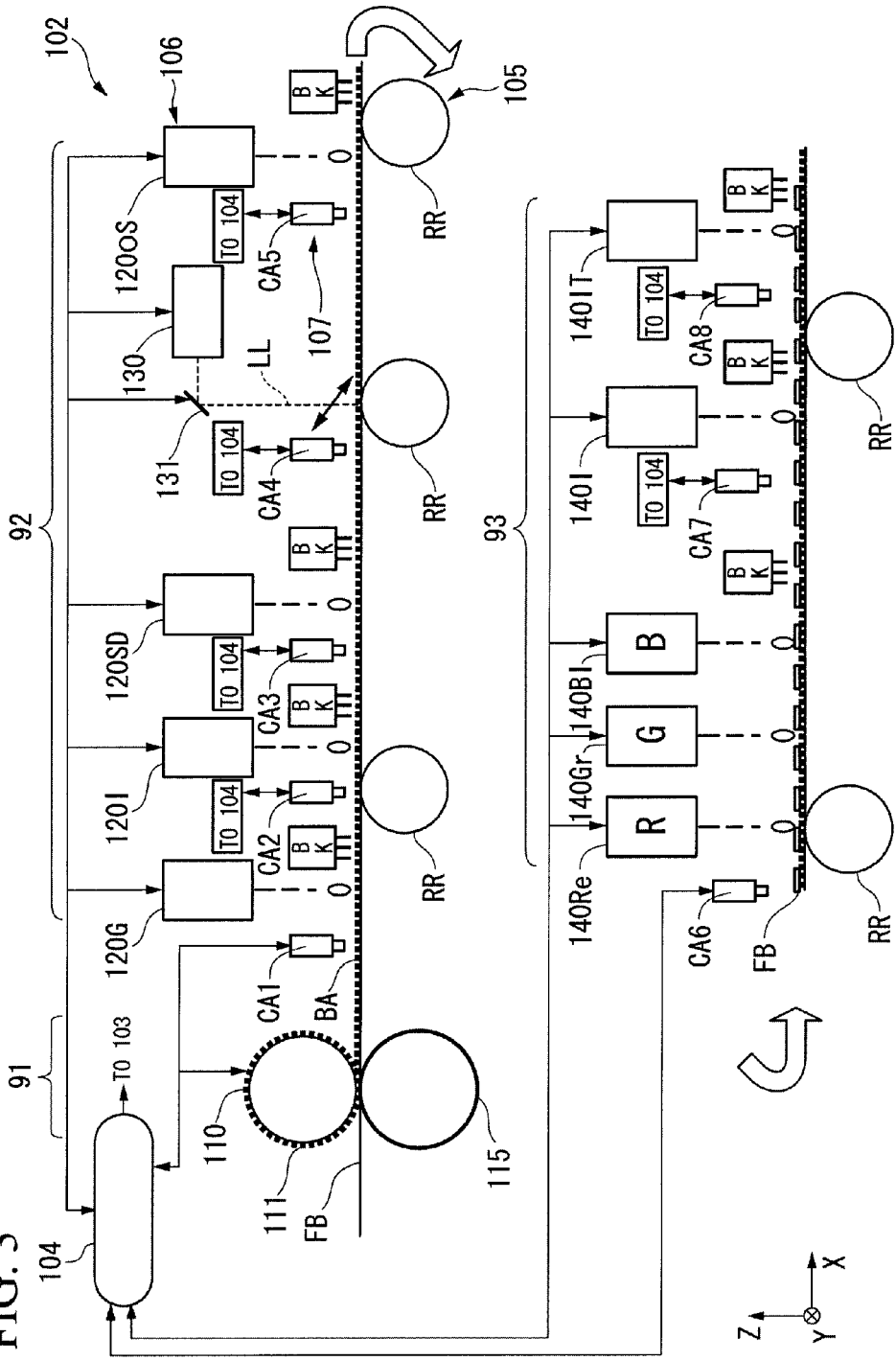
FIG. 3 is a diagram illustrating the configuration of a substrate-processing unit according to the embodiment.

FIG. 3 is a diagram illustrating the configuration of the substrate-processing unit 102.

As illustrated in FIG. 3, the substrate-processing unit 102 includes a conveying section 105, an element-forming section 106, an alignment section 107, and a substrate-cutting section 108. The substrate-processing unit 102 is a portion that forms each constituent element of the above-described organic EL element 50 on the sheet substrate FB while conveying the sheet substrate FB supplied from the substrate-supplying unit 101 and sends out the sheet substrate FB on which the organic EL element 50 is formed to the substrate-recovering unit 103.

The conveying section 105 includes a plurality of rollers RR arranged at positions disposed along the X direction. The sheet substrate FB is configured to be conveyed in the X-axis direction also in accordance with the rotation of the rollers RR. The roller RR may be a rubber roller that is interposed between both faces of the sheet substrate FB or may be a ratchet-attached roller RR in a case where the sheet substrate FB has perforations. Some rollers RR out of a plurality of rollers RR can be moved in the Y axis direction that is perpendicular to the conveying direction.

The element-forming section 106 includes a partition wall-forming portion 91, an electrode-forming portion 92, and a light-emitting layer-forming portion 93. The partition wall-forming portion 91, the electrode-forming portion 92, and the light-emitting layer-forming portion 93 are arranged in the order of the partition wall-forming portion 91, the electrode-forming portion 92, and the light-emitting layer-forming portion 93 from the upstream side to the downstream side in the conveying direction of the sheet substrate FB. Hereinafter, each configuration of the element-forming section 106 will be described.

The partition wall-forming portion 91 includes an imprint roller 110 and a thermal transfer roller 115. The partition wall-forming portion 91 forms the partition walls BA for the sheet substrate FB sent out from the substrate-supplying unit 101. In the partition wall-forming portion 91, the sheet substrate FB is pressed by the imprint roller 110, and the sheet substrate FB is heated up to a temperature equal to or higher than the glass transition point by the thermal transfer roller 115 such that the pressed partition walls BA maintain their shape. Accordingly, the mold shape formed on the roller surface of the imprint roller 110 is configured to be transferred to the sheet substrate FB. The sheet substrate FB is configured to be heated, for example, to about 200° C. by the thermal transfer roller 115.

The roller surface of the imprint roller 110 is mirror-finished, and a fine imprint mold 111 configured by using a material such as SiC or Ta is attached to the roller surface. The fine imprint mold 111 forms a stamper used for the wiring of a thin film transistor and a stamper used for a color filter.

The imprint roller 110 forms alignment marks AM on the sheet substrate FB by using the fine imprint mold 111. In order to form the alignment marks AM on both sides in the Y axis direction that is the widthwise direction of the sheet substrate FB, the fine imprint mold 111 includes a stamper used for the alignment marks AM.

The electrode-forming portion 92 is disposed on the +X side of the partition wall-forming portion 91 and, for example, forms a thin film transistor using an organic semiconductor. More particularly, after forming the gate electrode G, the gate-insulating layer I, the source electrode S, the drain electrode D, and the pixel electrode P as illustrated in FIG. 1, the electrode-forming portion 92 forms the organic semiconductor layer OS.

As the material of the thin film transistor (TFT), an organic semiconductor may be used although the thin film transistor is of an inorganic semiconductor system. As a thin film transistor of an inorganic semiconductor, although a thin film transistor of an amorphous silicon system is known, a thin film transistor using an organic semiconductor may be used as well. By configuring a thin film transistor by using such an organic semiconductor, the thin film transistor can be formed by using a printing technique or a liquid droplet-coating technique. In addition, a field-effect transistor (FET) as illustrated in FIG. 1 is particularly preferable out of the thin film transistors using organic semiconductors.

The electrode-forming portion 92 includes a liquid droplet-coating apparatus 120, a thermal treatment apparatus BK, a cutting apparatus 130, and the like.

In this embodiment, as the liquid droplet-coating apparatus 120, for example, a liquid droplet-coating apparatus 120G that is used when the gate electrode G is formed, a liquid droplet-coating apparatus 120I that is used when the gate-insulating layer I is formed, a liquid droplet-coating apparatus 120SD that is used when the source electrode S, the drain electrode D, and the pixel electrode P are formed, a liquid droplet-coating apparatus 120OS that is used when the organic semiconductor OS is formed, and the like are used.

Figure 4:
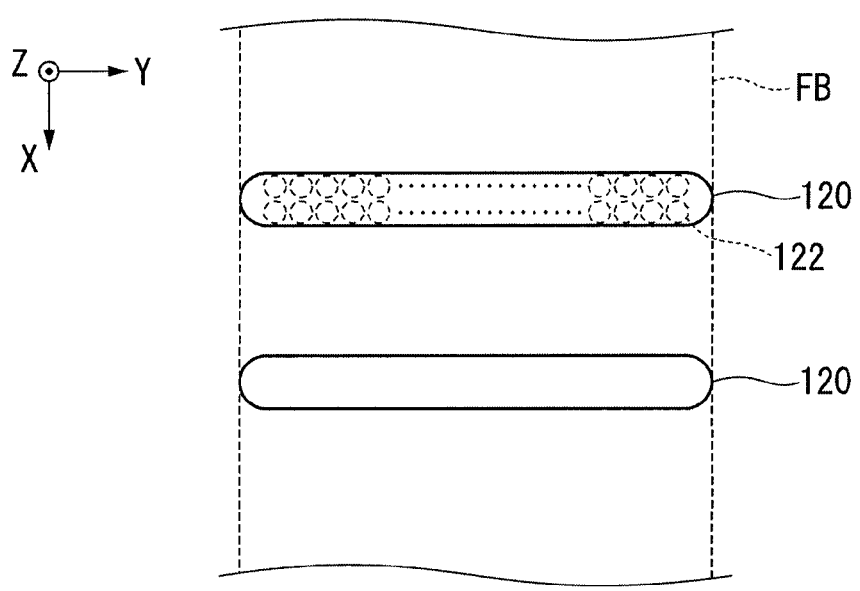
FIG. 4 is a diagram illustrating the configuration of a liquid droplet-coating apparatus according to the embodiment.

FIG. 4 is a plan view illustrating the configuration of the liquid droplet-coating apparatus 120. FIG. 4 illustrates the configuration of the liquid droplet-coating apparatus 120 when seen on the +Z side. The liquid droplet-coating apparatus 120 is formed longitudinally in the Y axis direction. In the liquid droplet-coating apparatus 120, a driving apparatus, which is not illustrated in the figure, is disposed. The liquid droplet-coating apparatus 120 is configured to be movable, for example, in the X direction, the Y direction, and the θZ direction by using the driving apparatus.

In the liquid droplet-coating apparatus 120, a plurality of nozzles 122 is formed. The nozzle 122 is disposed on a face of the liquid droplet-coating apparatus 120 that faces the sheet substrate FB. The nozzles 122, for example, are arranged along the Y axis direction, and, for example, two rows (nozzle rows) of the nozzles 122 are formed. The control section 104 can perform liquid droplet coating from all the nozzles 122 or can individually adjust the timing of liquid droplet coating from each nozzle 122.

As the liquid droplet-coating apparatus 120, for example, an ink jet type or a dispenser type can be employed. As examples of the ink jet type, there are a charging control type, a compression vibration type, an electromechanical transduction type, an electro-thermal conversion type, an electrostatic attraction type, and the like. According to the liquid droplet-coating method, the material is effectively used, and a material of a desired amount can be precisely arranged at a desired position. In addition, the amount of one droplet of metal ink that is used for coating by using the liquid droplet-coating method, for example, is 1 to 300 nano grams.

Referring back to FIG. 2, the liquid droplet-coating apparatus 120G coats the inside of the partition walls BA of the gate bus line GBL with metal ink. The liquid droplet-coating apparatus 120I coats a switching portion with electrically-insulated ink formed from polyimide-based resin or urethane-based resin. In addition, the liquid droplet-coating apparatus 120SD coats the inside of the partition wall BA of the source bus line SBL and the inside of the partition wall BA of the pixel electrode P with the metal ink. The liquid droplet-coating apparatus 120OS coats the switching portion disposed between the source electrode S and the drain electrode D with organic semiconductor ink.

The metal ink is a liquid in which conductive bodies having a particle diameter of about 5 nm are stabilized and dispersed in a room-temperature solvent, and, as the material of the conductive bodies, carbon, silver (Ag), gold (Au), or the like is used. The compound that forms the organic semiconductor ink may be either a monocrystalline material or an amorphous material and may be either a low-molecular-weight material or a high-molecular-weight material. As examples of preferable compounds that form the organic semiconductor ink, there is a monocrystal or π-conjugated-system high-molecular-weight compound of a condensed ring system aromatic hydrocarbon compound that is represented by pentacene, triphenylene, anthracene, or the like.

The thermal treatment apparatus BK is arranged on the +X side (the downstream side in the substrate conveying direction) of each liquid droplet-coating apparatus 120. The thermal treatment apparatus BK, for example, can emit a hot air, far-infrared rays, or the like to the sheet substrate FB. The thermal treatment apparatus BK dries or bakes liquid droplets with which the sheet substrate FB is coated so as to be hardened by using the radiated heat.

The cutting apparatus 130 is disposed on the +X side of the liquid droplet-coating apparatus 120SD and on the upstream side of the liquid droplet-coating apparatus 120OS. The cutting apparatus 130 cuts off the source electrode S and the drain electrode D formed by the liquid droplet-coating apparatus 120SD, for example, by using laser light or the like. The cutting apparatus 130 includes a light source, which is not illustrated in the figure, and a galvanometer mirror 131 that projects laser light emitted from the light source onto the sheet substrate FB.

As the kind of the laser light, laser of a wavelength that is absorbed in the metal film to be cut is preferable to be used, and, as the wavelength-converted laser, second, third, or fourth harmonic waves such as YAG may be used. In addition, by using a pulse-type laser, thermal diffusion is prevented, and damage to portions other than the cut portion can be reduced. In a case where the material is aluminum, femtosecond laser of a wavelength of 760 nm is preferable.

In this embodiment, for example, a femtosecond laser irradiation unit that uses titanium sapphire laser is used as the light source. The femtosecond laser irradiation unit is configured to emit laser light LL, for example, as a pulse in the range of 10 KHz to 40 KHz.

In this embodiment, since the femtosecond laser is used, processing in the order of sub-microns can be performed, and a gap between the source electrode S and the drain electrode D, which determines the performance of a field-effect transistor, can be correctly cut. The gap between the source electrode S and the drain electrode D, for example, is in the range of about 3 μm to 30 μm.

Other than the above-described femtosecond laser, for example, carbon dioxide laser, green laser, or the like can be used. In addition, other than the laser, a configuration may be employed in which the substrate is mechanically cut by using a dicing saw or the like.

The galvanometer mirror 131 is arranged in the optical path of the laser light LL. The galvanometer mirror 131 reflects the laser light LL emitted from the light source onto the sheet substrate FB. The galvanometer mirror 131 is disposed so as to be rotatable, for example, in the θX direction, the θY direction, and the θZ direction. By rotating the galvanometer mirror 131, the emission position of the laser beam LL is changed.

By using both the partition wall-forming portion 91 and the electrode-forming portion 92, a thin film transistor and the like can be formed by using a printing technique or a liquid droplet-coating method without using a so-called photolithographic process. For example, in a case where only the electrode-forming portion 92, for which a printing technique, a liquid droplet-coating method, or the like is used, is used, there is a case where a thin film transistor and the like may not be formed with high precision due to blurring or spreading of ink.

In contrast to this, by using the partition wall-forming portion 91, the partition walls BA are formed, whereby blurring and spreading of ink are prevented. In addition, the gap between the source electrode S and the drain electrode D, which determines the performance of a thin film transistor, is formed through laser processing or mechanical processing.

The light-emitting layer-forming portion 93 is arranged on the +X side of the electrode-forming portion 92. The light-emitting layer-forming portion 93 forms a light-emitting layer IR, a pixel electrode ITO, and the like on the sheet substrate FB on which electrodes are formed. The light-emitting layer-forming portion 93 includes a liquid droplet-coating apparatus 140 and the thermal treatment apparatus BK.

The light-emitting layer IR formed by the light-emitting layer-forming portion 93 contains a host compound and a phosphorescent compound (also referred to as a phosphorescent light-emitting compound). The host compound is a compound that is contained in the light-emitting layer. The phosphorescent compound is a compound in which light emission is observed from an excited triplet and emits phosphorescent light at room temperature.

In this embodiment, as the liquid droplet-coating apparatus 140, for example, a liquid droplet-coating apparatus 140Re that forms a red light-emitting layer, a liquid droplet-coating apparatus 140Gr that forms a green light-emitting layer, a liquid droplet-coating apparatus 140Bl that forms a blue light-emitting layer, a liquid droplet-coating apparatus 140I that forms an insulating layer, a liquid droplet-coating apparatus 140IT that forms a pixel electrode ITO, and the like are used.

As the liquid droplet-coating apparatus 140, similarly to the above-described liquid droplet-coating apparatus 120, an inkjet type or a dispenser type can be employed. In a case where, for example, a hole transport layer, an electron transport layer, and the like are disposed as the constituent elements of the organic EL element 50, an apparatus (for example, a liquid droplet-coating apparatus, or the like) that forms such layers is separately disposed.

The liquid droplet-coating apparatus 140Re coats the pixel electrode P with an R solution on the upper side. In the liquid droplet-coating apparatus 140Re, the amount of ejection of the R solution is adjusted such that the film thickness after drying is 100 nm. As the R solution, for example, a solution is used which is acquired by dissolving a red dopant material in 1,2-dichloroethane in polyvinyl carbazole (PVK) as a host material.

The liquid droplet-coating apparatus 140Gr coats the pixel electrode P with a G solution on the upper side. As the G solution, for example, a solution is used which is acquired by dissolving a green dopant material in 1,2-dichloroethane in PVK as a host material.

The liquid droplet-coating apparatus 140Bl coats the pixel electrode P with a B solution on the upper side. As the B solution, for example, a solution is used which is acquired by dissolving a blue dopant material in 1,2-dichloroethane in PVK as a host material.

The liquid droplet-coating apparatus 120I coats a part of the gate bus line GBL or the source bus line SBL with electrically-insulated ink. As the electrically insulating ink, for example, ink of a polyimide-system resin or urethane-system resin is used.

The liquid droplet-coating apparatus 120IT coats the red, green, and blue light-emitting layers with ITO (Indium Tin Oxide) on the upper side. As the ITO ink, a compound acquired by adding tin oxide ($SnO_2$) of several % to indium oxide ($In_2O_3$) or the like is used. In addition, an amorphous material such as IDIXO ($In_2O_3$—ZnO) that can be used for manufacturing a transparent conductive film may be used. It is preferable that the transmittance of the transparent conductive film be equal to or higher than 90%.

The thermal treatment apparatus BK is arranged on the +X side (the downstream side in the substrate conveying direction) of each liquid droplet-coating apparatus 140. The thermal treatment apparatus BK, similarly to the thermal treatment apparatus BK used at the electrode-forming portion 92, for example, can emit hot air, far-infrared rays, or the like to the sheet substrate FB. The thermal treatment apparatus BK dries or bakes liquid droplets with which the sheet substrate FB is coated so as to be hardened by using the radiated heat.

The alignment section 107 includes a plurality of alignment cameras CA (CA1 to CA8) disposed in the X direction. The alignment camera CA may be configured to perform imaging by using CCDs or CMOSs under the illumination of visible light and detect the position of an alignment mark AM by processing the captured image or may emit laser light to the alignment mark AM and detect the position of the alignment marks AM by receiving the scattering light.

The alignment camera CA1 is arranged on the +X side of the thermal transfer roller 115. The alignment camera CA1 detects the position of the alignment mark AM formed by the thermal transfer roller 115 on the sheet substrate FB. The alignment cameras CA2 to CA8 are arranged on the +X side of the thermal treatment apparatus BK. The alignment cameras CA2 to CA8 detect the position of the alignment mark AM of the sheet substrate FB that has passed through the thermal treatment apparatus BK.

There is a case where the sheet substrate FB expands or contracts in the X axis direction and the Y axis direction by passing through the thermal transfer roller 115 and the thermal treatment apparatus BK. By arranging the alignment camera CA on the +X side of the thermal transfer roller 115 that performs a thermal treatment as above or the +X side of the thermal treatment apparatus BK, the positional deviation of the sheet substrate FB due to thermal deformation or the like can be detected.

The detection results acquired by the alignment cameras CA1 to CA8 are configured to be transmitted to the control section 104. For example, the control section 104 is configured to perform, adjustment of the coating position and the coating timing of ink for the liquid droplet-coating apparatus 120 and the liquid droplet-coating apparatus 140, adjustment of the supply speed of the sheet substrate FB from the substrate-supplying unit 101 or the conveying speed of the roller RR, adjustment of the movement according to the roller RR in the Y direction, and adjustment of the cutting position, the cutting timing, and the like of the cutting apparatus 130, based on the detection results of the alignment cameras CA1 to CA8.

(Substrate Cartridge)

In this embodiment, as the substrate-supplying unit 101 and the substrate-recovering unit 103, the substrate cartridge 1 is used. In the description presented below, for convenience of the description, the XYZ orthogonal coordinate system that is common to FIG. 2 is set, and the positional relationship of each member will be described with reference to this XYZ orthogonal coordinate system. Hereinafter, the XYZ orthogonal coordinate system will be described for a case where the substrate cartridge 1 is used as the substrate-supplying unit 101 in a state in which the substrate-supplying unit 101 is connected to the substrate-processing unit 102 as an example.

Figure 5:
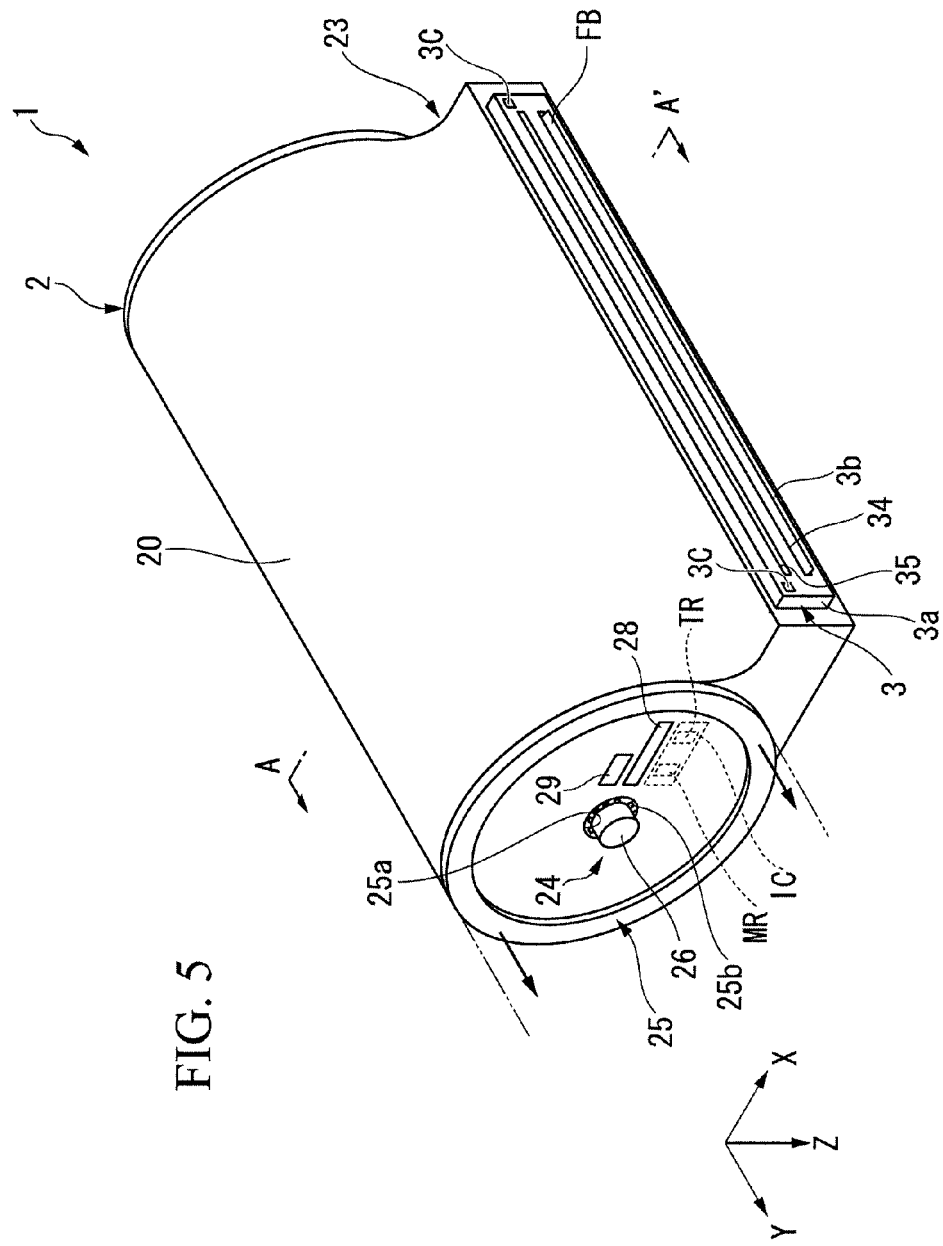
FIG. 5 is a perspective view illustrating the configuration of a substrate cartridge according to the embodiment.
Figure 6:
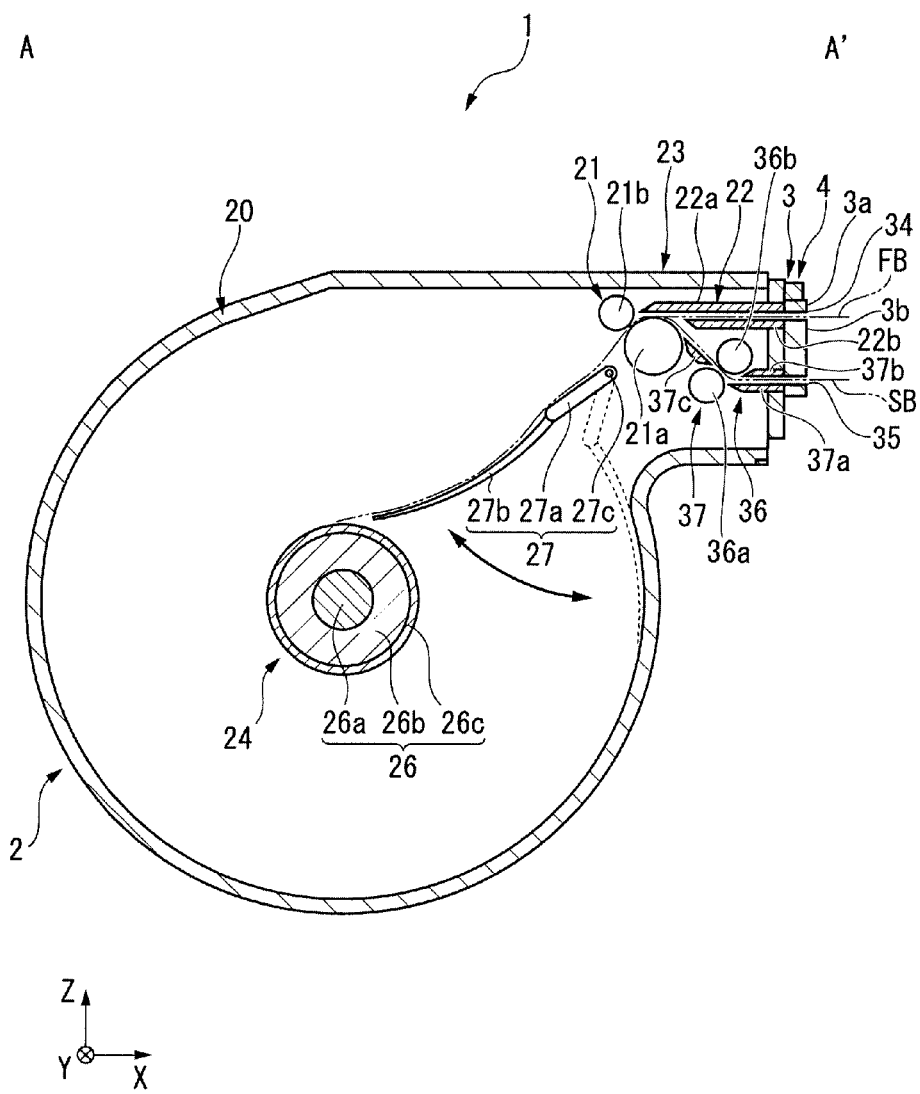
FIG. 6 is a cross-sectional view illustrating the configuration of the substrate cartridge according to the embodiment.

FIG. 5 is a perspective view illustrating the configuration of the substrate cartridge 1. FIG. 6 is a diagram illustrating the configuration taken along line A-A' shown in FIG. 5. As illustrated in FIGS. 5 and 6, the substrate cartridge 1 includes a cartridge main body 2 and a mounting unit 3.

The cartridge main body 2 is a portion that houses the sheet substrate FB. The cartridge main body 2 includes a housing portion 20, a conveying portion (conveying mechanism) 21, a substrate-guiding portion 22, a second substrate-conveying portion 36, and a second substrate-guiding portion 37. In addition, the above-described mounting unit 3 is disposed in the cartridge main body 2. For example, the cartridge main body 2 is formed from aluminum or duralumin and the like.

The housing portion 20 is a portion that houses the sheet substrate FB. The housing portion 20, for example, is formed in a cylinder shape so as to house the sheet substrate FB wound in a roll shape, and a part thereof is disposed so as to protrude to the +X side (protruded portion 23). In this embodiment, the housing portion 20 is arranged in a state extending in the Y direction in the figure. The housing portion 20 includes a lid portion 25 and a substrate-driving mechanism 24.

The lid portion 25 is disposed in the end portion of the housing portion 20 on the +Y side or the end portion on the −Y side. The lid portion 25 is detachably attached to the housing portion 20. By detachably attaching the lid portion 25 to the housing portion 20, the inside of the housing portion 20 can be directly accessed. As an opening/closing mechanism of the lid portion 25, for example, a configuration in which screw threads engaging with each other are disposed in the lid portion 25 and the housing portion 20 may be employed or a configuration in which the lid portion 25 and the housing portion 20 are connected to each other by a hinge mechanism may be employed. The lid portion 25 includes a window portion 28 and a display portion 29.

The window portion 28, for example, is formed from a material that can transmit visible light such as glass or plastic. The inside of the housing portion 20 can be observed through the window portion 28. The display portion 29 is a portion in which information such as the state of the sheet substrate FB is displayed. In the display portion 29, for example, the longitudinal size of the sheet substrate FB housed in the housing portion 20, the remaining length of the sheet substrate FB, and the like are displayed.

The substrate-driving mechanism 24 is a portion that performs an operation of winding up the sheet substrate FB and an operation of sending out the sheet substrate FB. The substrate-driving mechanism 24 is disposed inside the housing portion 20. The substrate-driving mechanism 24 includes a roller portion (shaft portion) 26 and the guide portion 27. The roller portion 26, as illustrated in FIG. 6, includes a rotation shaft member 26a, a diameter expansion portion 26b, and a bonding portion 26c.

The rotation shaft member 26a is a cylinder-shaped member that is formed from high-rigidity metal such as aluminum. The rotation shaft member 26a is supported to be rotatable, for example, through an opening portion 25a and a bearing member 25b disposed in the center portion of the lid portion 25. In such a case, the center shaft of the rotation shaft member 26a, for example, is in a state of being parallel to the Y direction, and the rotation shaft member 26a is rotated in the θY direction.

The rotation shaft member 26a is connected to a rotation driving mechanism that is not illustrated in the figure. By controlling the driving of the rotation driving mechanism, the rotation shaft member 26a is rotated around the center shaft as its center. The rotation driving mechanism, as illustrated in FIG. 6, can rotate the rotation shaft member 26a, for example, in any one of the +θY direction and −θY direction.

The diameter expansion portion 26b is formed to have a uniform thickness on the surface of the rotation shaft member 26a. The diameter expansion portion 26b is formed so as to rotate integrally with the rotation shaft member 26a. The bonding portion 26c is formed to have a uniform thickness on the surface of the diameter expansion portion 26b in the cross-sectional view. The bonding portion 26c is formed by using a material having sufficient adhesiveness for bonding the sheet substrate FB.

The guide portion 27 includes a rotation member (first guide member) 27a and a tip end member (first guide member) 27*b*. The rotation member 27*a*, for example, has one end attached to the housing portion 20 through the shaft portion 27*c* and is disposed so as to be rotatable around the shaft portion 27*c* in direction θY. The rotation member 27*a* is connected to a rotation driving mechanism that is not illustrated in the figure.

The tip end member 27*b* is connected to the other end of the rotation member 27*a* in the cross-sectional view. For example, the tip end member 27*b* is formed to have an arc-shaped curved face in the cross-sectional view. The sheet substrate FB is guided to the roller portion 26 through the +Z-side curved face, which has an arc shape in the cross-sectional view, installed in the tip end member 27*b*. The tip end member 27*b* is configured to be rotated integrally with the rotation member 27*a*. For example, in a case where the rotation member 27*a* is turned in a direction (the outward diameter direction of the roller portion 26) departing away from the roller portion 26, the tip end member 27*b* is brought into contact with the inner circumference of the housing portion 20. Accordingly, a contact between the tip end member 27*b* and the sheet substrate FB wound around the roller portion 26 is avoided.

The mounting unit 3 is a portion that is connected to the substrate-processing unit 102. The mounting unit 3, for example, is disposed in the +X-side end portion of the protruded portion 23 disposed in the housing portion 20. The mounting unit 3 includes an insertion portion 3*a* that is used for a connection with the substrate-processing unit 102. In an end face 3*b* of the insertion portion 3*a* that is located on the substrate-processing unit 102 side, a terminal 3*c* that is electrically connected to the substrate-processing unit 102 is disposed.

In a case where the substrate cartridge 1 is used as the substrate-supplying unit 101, the mounting unit 3 is connected to the supply-side connection portion 102A of the substrate-processing unit 102. In a case where the substrate cartridge 1 is used as the substrate-recovering unit 103, the mounting unit 3 is connected to the recovery-side connection portion 102B of the substrate-processing unit 102. Even in a case where the mounting unit 3 is connected to one of the substrate-supplying unit 101 of the substrate-processing unit 102 and the substrate-recovering unit 103, the mounting unit 3 is configured to be detachably attached thereto.

In the mounting unit 3, an opening portion 34 and a second opening portion 35 are arranged. The opening portion 34 is an opening portion that is arranged on the +Z side, and the sheet substrate FB is output or input between the opening portion and the cartridge main body 2. In the cartridge main body 2, the sheet substrate FB is housed through the opening portion 34. The sheet substrate FB housed in the cartridge main body 2 is sent outside the cartridge main body 2 through the opening portion 34.

The second opening portion 35 is an opening portion that is arranged on the −Z side, and a band-shaped second substrate SB other than the sheet substrate FB is output or input between the second opening portion and the cartridge main body 2. As an example of such a second substrate SB, there is a protective substrate, for example, protecting the element-forming face of the sheet substrate FB or the like. As the protective substrate, for example, inserting paper or the like can be used. The second opening portion 35, for example, is arranged so as to be spaced from the opening portion 34. For example, the second opening portion 35 is formed to be the same size and shape as the opening portion 34. In addition, as the material of the second substrate SB according to this embodiment, a material having conductivity such as a stainless steel thin plate (for example, the thickness is equal to or less than 0.1 mm or the like) may be used. In such a case, when the second substrate SB is housed in the cartridge main body 2 together with the sheet substrate FB, by electrically connecting the second substrate SB to the cartridge main body 2, the charging of the sheet substrate FB can be prevented.

The conveying portion 21, the substrate-guiding portion 22, the second substrate-conveying portion 36, and the second substrate-guiding portion 37, for example, are disposed inside the protruded portion 23. The substrate-guiding portion 22 is disposed between the opening portion 34 and the conveying portion 21. The substrate-guiding portion 22 is a portion that guides the sheet substrate FB between the opening portion 34 and the conveying portion 21. The substrate-guiding portion 22 includes substrate-guiding members 22*a* and 22*b*. The substrate-guiding members 22*a* and 22*b* are arranged so as to face each other with a space 22*c* interposed therebetween in the Z direction, and the opposing faces are disposed so as to be approximately parallel to the XY plane. The gap 22*c* is connected to the opening portion 34, and the sheet substrate FB is configured to be moved between the opening portion 34 and the gap 22*c*.

The second substrate-guiding portion 37 is a portion that guides the second substrate SB between the mounting unit 3 and the conveying portion 21. The second substrate-guiding portion 37 includes second substrate-guiding members 37*a*, 37*b*, and 37*c*. The second substrate-guiding members 37*a* and 37*b* are arranged so as to face each other with a space 37*d* interposed therebetween in the Z direction, and the opposing faces are disposed so as to be approximately parallel to the XY plane. The second substrate-guiding member 37*c* is tiltedly arranged such that the second substrate SB is guided to the +Z side. In particular, the −X-side end portion of the second substrate-guiding member 37*c* is arranged in a state being tilted to the +Z side with respect to the +X-side end portion.

The second substrate-conveying portion 36 conveys the second substrate SB between the mounting unit 3 and the conveying portion 21. The second substrate-conveying portion 36 is arranged between the second substrate-guiding members 37*a* and 37*b* and the second substrate-guiding member 37*c*. The second substrate-conveying portion 36 includes a main driving roller 36*a* and a driven roller 36*b*. The main driving roller 36*a* is disposed so as to be rotatable, for example, in the θY direction and is connected to a rotation driving mechanism not illustrated in the figure. The driven roller 36*b* is arranged so as to have a space from the main driving roller 36*a* such that the second substrate SB is interposed between the main driving roller 36*a* and the driven roller 36*b*.

The conveying portion 21 conveys the sheet substrate FB and the second substrate SB between the mounting unit 3 and the housing portion 20. The conveying portion 21 includes a tension roller (tension mechanism) 21*a* and a measurement roller (measurement portion) 21*b*. The tension roller 21*a* is a roller that applies tension to the sheet substrate FB and the second substrate between the roller portion 26 and the tension roller 21*a*. The tension roller 21*a* is disposed so as to be rotatable in the θY direction. For example, a rotation mechanism not illustrated in the figure is connected to the tension roller 21*a*. In addition, the tension roller 21*a* and the measurement roller 21*b* may be disposed so as to be respectively movable in the Z direction shown in FIG. 6.

The measurement roller 21*b* is a roller that has a diameter smaller than that of the tension roller 21*a*. The measurement roller 21*b* is arranged so as to have a predetermined gap between the tension roller 21*a* and the measurement roller 21*b* such that the sheet substrate FB and the second substrate SB are interposed between the tension roller 21a and the measurement roller 21b. A configuration may be employed in which the size of the gap between the measurement roller 21b and the tension roller 21a can be adjusted so as to interpose only the sheet substrate FB or both the sheet substrate FB and the second substrate SB therebetween. The measurement roller 21b is a driven roller that is rotated in accordance with the rotation of the tension roller 21a.

By rotating the tension roller 21a in the state in which the sheet substrate FB is interposed between the tension roller 21a and the measurement roller 21b, the sheet substrate FB can be conveyed in the winding-up direction and the sending-out direction of the sheet substrate FB while tension is applied to the sheet substrate FB.

The conveying portion 21 includes a detection portion 21c that detects, for example, the rotation number or the rotation angle of the measurement roller 21b. As the detection portion 21c, for example, an encoder or the like is used. According to the detection portion 21c, for example, the conveying distance of the sheet substrate FB through the measurement roller 21b or the like can be measured.

For example, in a case where the sheet substrate FB is inserted through the opening portion 34, and the second substrate SB is inserted through the second opening portion 35, the sheet substrate FB and the second substrate SB are guided by the substrate-guiding portion 22 and the second substrate-guiding portion 37 respectively, thereby joining together in a joining portion 39. At this time, the sheet substrate FB and the second substrate SB joined in the joining portion 39 are conveyed by the conveying portion 21 in the state of being joined. At this time, the conveying portion 21 presses the sheet substrate FB and the second substrate SB so as to be brought into tight contact with each other. Accordingly, the conveying portion 21 also serves as a pressing mechanism that presses the second substrate SB to the sheet substrate FB.

In the cartridge main body 2, an information-maintaining section IC is disposed (see FIG. 5). The information-maintaining section IC, for example, is configured by an IC chip (for example, a read-only type, a readable and writable type, or the like) or the like and is, for example, embedded in the cartridge main body 2. The information-maintaining section IC includes a memory portion MR, for example, that stores information such as the specification information relating to the specification values of the sheet substrate FB housed in the cartridge main body 2, process information that is based on the specification information, or identification information used for identifying the cartridge main body 2, and a communication portion CR that transmits or receives the information stored in the memory portion MR. In this embodiment, although the memory portion MR is configured to store two kinds of information including the specification information and the identification information, a configuration may be employed which stores information that includes any one thereof. The communication portion CR is not limited to the configuration being disposed inside the information-maintaining section IC as in this embodiment, and, for example, the communication unit CR may be configured to be disposed independently from the information-maintaining section IC.

In this embodiment, although a configuration is illustrated as an example in which only one information-maintaining section IC is disposed, a configuration may be employed in which a plurality of the information-maintaining sections ICs is disposed in the cartridge main body 2. As such an example, for example, there is a configuration or the like in which the above-described information is maintained as a one-dimensional or two-dimensional bar code, and a formed seal of the bar code is affixed to a place other than the above-described information-maintaining section IC. In addition, the configuration of the information-maintaining section IC is not limited to the configuration in which the information-maintaining section IC is embedded in the cartridge main body 2, and, for example, a configuration may be employed in which the information-maintaining section IC is detachably attached to the cartridge main body 2. As an example of such a configuration, for example, there is a configuration in which the IC chip and the like are configured to be detachably attached or the like. In addition, for example, in a case where the seal on which the bar code is formed is used, the seal can be peeled off from the cartridge main body 2 and can be separated from the cartridge main body 2. In addition, a configuration may be employed in which the information-maintaining section IC is configured to be electrically connected to the display portion 29, and the information maintained in the information-maintaining section IC is displayed on the display portion 29. Furthermore, at least a part of the information maintained by the information-maintaining section IC may be configured to be maintained in the sheet substrate FB. As examples of such a configuration, there are a configuration in which a one-dimensional or two-dimensional bar code or the like is formed on the sheet substrate FB, a configuration in which an IC tag and the like are embedded in the sheet substrate FB, or the like.

As examples of the specification values, there are the material, the flexibility, the heat-resistance, the abrasion property, the thickness, the friction coefficient, the tension-resistance, the elasticity, the tension, the expansion coefficient, and the like of the sheet substrate FB. In addition, the elasticity may be a value relating to the heat or the tension that is applied to the sheet substrate FB or a value relating to the heat and the tension. In addition, the specification values include a lyophilic property of a predetermined liquid adhering to the sheet substrate FB, the drying property of the predetermined liquid on the sheet substrate FB, and the like. The predetermined liquid includes, for example, liquid droplets, metal ink, and electrically insulating ink, that are discharged from the liquid droplet-coating apparatus 120, a solution discharged from the liquid droplet-coating apparatus 140, and the like. In addition, the specification information includes pretreatment information relating to a pretreatment performed for the sheet substrate FB. The pretreatment information is information of a treatment performed for the sheet substrate FB before it is housed in the cartridge main body 2. As examples of such pretreatments, there are a modification treatment (a liquid-repellent treatment, a lyophilic treatment, or the like), a process of forming a protective surface film for the sheet substrate FB, and the like. As examples of the lyophilic treatment, there is a lyophilic treatment for ink discharged from the liquid droplet-coating apparatuses 120 and 140 and the like.

The process information is information relating to a process performed for the sheet substrate FB and is information that includes a process ID, a process name, and the like corresponding to the specification information. The process performed for the sheet substrate FB includes at least one unit process corresponding to the specification information of the sheet substrate FB. In this embodiment, processes performed by each constituent element of the substrate-processing apparatus 100 and the like correspond to unit processes. In such processes, each process performed for the substrate is included, and, for example, a heating process, a cooling process, a conveying process, a press process, a coating process, a deposition process, a sputtering process, a light-emitting process, an electronic ray-emitting process, an exposure process, a developing process, a dip treatment, a drying process, a physical processing process (cutting, partial removal, or the like), a chemical target process (a dissolving process or the like), a process of bonding with another substrate, a detection process, an alignment process, a modification treatment, a partition wall-forming process and the like are included.

The information-maintaining section IC, for example, is electrically connected to the terminal $3c$. When the substrate cartridge 1 is connected to the substrate-processing unit 102, the terminal $3c$ is configured to be connected to an apparatus-side terminal 102C (see FIG. 2) disposed in the supply-side connection portion 102A of the substrate-processing unit 102. In such a case, the information-maintaining section IC is electrically connected to the substrate-processing unit 102 through the terminal $3c$ and can deliver information to the substrate-processing unit 102 through the terminal $3c$. In addition, the information-maintaining section IC can communicate with the communication portion 104CR (see FIG. 2) disposed in the control section 104 of the substrate-processing apparatus 100 through the communication portion CR for information. In such a case, the delivery of information between the substrate cartridge 1 and the substrate-processing unit 102 can be controlled by the control section 104.

In addition, in the memory portion MR of the information-maintaining section IC, separated from the above-described information, for example, a variety of process information such as information relating to tact and throughput of the substrate-processing apparatus 100, information relating to the conveying speed of the substrate cartridge 1 and the winding-up and the sending-out speed of the roller portion 26, and information relating to the sheet substrate FB may be stored. Here, "tact" represents a processing time per the unit processing area (for example, an area that can be processed by the above-described liquid droplet-coating apparatuses 120 and 140 and the like at once, a screen area per panel of the organic EL element 50, or a panel entire-face area). In addition, "throughput" represents the amount (for example, the length, the number of panels, the number of substrate cartridges 1, or the like) of the sheet substrate FB that can be processed per unit time. Such process information, similarly to the identification information, the specification information, the process information, or the like, is delivered to the control section 104 through the communication portion CR.

FIGS. 7A and 7B are tables of information stored in the control section 104.

In the control section 104, for example, a database 104DB has a first table in which the identification information, the specification information table, and the process information (the process ID) are stored in association with one another and a second table in which the combined information of the process ID and the unit process are stored in association with each other is disposed.

FIG. 7A is a diagram illustrating the first table, and FIG. 7B is a diagram illustrating a second table. As illustrated in FIG. 7A, in the first table Tb1, the identification information, for example, is stored as N1, N2, N3, . . . . In addition, in the first table Tb1, specification information of a sheet substrate FB housed in the substrate cartridge 1 corresponding to the identification information is stored for each specification value. In the example illustrated in FIG. 7A, as the specification information of the sheet substrate FB, three specification values of the material, the flexibility, and the heat-resistance of the sheet substrate FB are represented as an example. Here, for simplicity of description, as a representative example of the specification value, although a description will be made using the three above-described values, actually, a greater number of specification values than in this case are stored. In such a case, the specification values of the materials, for example, are stored as "material M1, material M2, material M3, . . . " and the like, the specification values of the flexibility, for example, are stored as "flexibility F1, flexibility F2, flexibility F3, . . . ", and the specification values of the heat resistance, for example, are stored as "heat-resistance HR1, heat-resistance HR2, heat-resistance HR3, . . . ". In addition, in the first table Tb1, the process ID corresponding to each combined solution of the specification values is stored. The process IDs, for example, are stored as "ID1, ID2, and ID3, . . . ". The process ID is linked with the second table illustrated in FIG. 7B.

As illustrated in FIG. 7B, in the second table Tb2, the combination of the above-described unit processes corresponding to each process ID is stored. In FIG. 7B, unit process A of the conveying section 105 of the above-described substrate-processing unit 102, unit process B of the partition wall-forming portion 91 of the element-forming section 106, unit process C of the electrode-forming portion 92, and unit process D of the light-emitting layer-forming portion 93 are illustrated as an example of a combination of unit processes. In addition, the unit process, for example, may be the process of the alignment section 107, the process of the substrate-cutting section 108, or the like.

In FIG. 7B, for example, as a combination of unit processes corresponding to the process ID1, "unit process A1, unit process B3, unit process C2, unit process D3, . . . " are stored. In addition, as a process corresponding to the process ID2, "unit process A2, unit process B1, unit process C3, unit process D2, . . . " are stored. As a process corresponding to the process ID3, "unit process A1, unit process B2, unit process C1, unit process D1, . . . " are stored.

In addition, for example, unit process A1 and unit process A2 in unit process A may be configured to be processes having conveying speeds, pressing forces of the roller RR, and the like that are different from each other. For example, unit processes B1 to B3 in unit process B may be configured to be processes having the types, the degrees of hardness, the pitches of the imprint mold 111 of the imprint roller 110 or the like that are different from each other or processes having different heating temperatures of the thermal transfer roller 115. For example, unit processes C1 to C3 in unit process C and D1 to D3 in unit process D may be processes of forming electrodes through deposition or processes of forming electrodes by using a sputtering method instead of the coating process using the liquid droplet-coating apparatus 120 or the liquid droplet-coating apparatus 140, unlike this embodiment, as the process of forming electrodes that is performed by the electrode-forming portion 92. In such a case, in the configuration of the substrate-processing unit 102, a deposition device, a sputtering device, or the like other than the liquid droplet-coating apparatuses 120 and 140 is additionally disposed, and the control section 104 controls the devices so as to perform processes corresponding to the process ID. In addition, for example, in a case where the above-described liquid droplet-coating apparatuses 120 and 140 are used, the unit process may differ in accordance with the type of the used liquid droplets. Similarly, in the unit process, in a case where the process can be performed in different conditions, the unit process may be stored as different processes for each condition.

(Operation of Housing Sheet Substrate in Substrate Cartridge)

Figure 8:
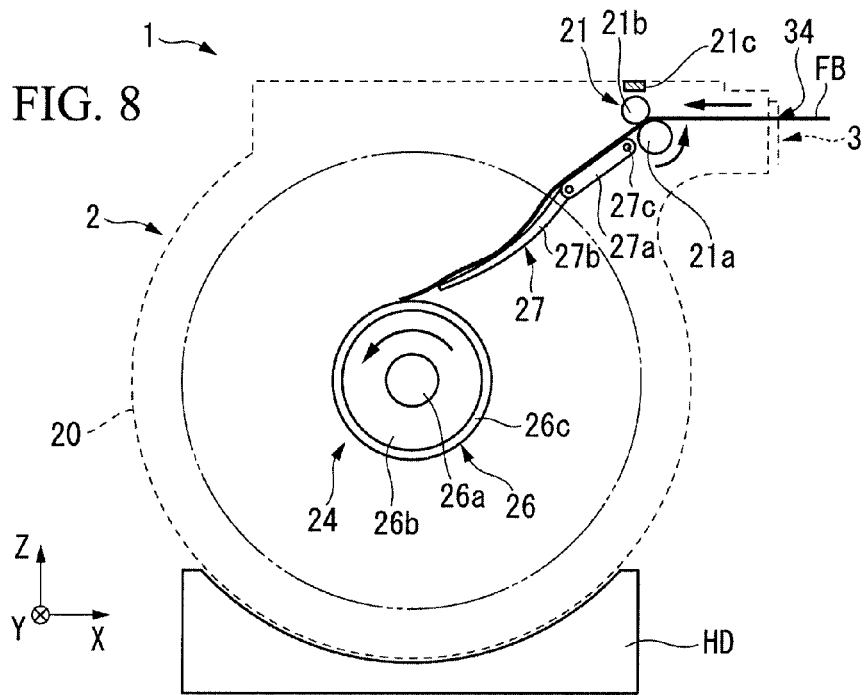
FIG. 8 is a diagram illustrating an operation of housing the substrate cartridge according to the embodiment.
Figure 9:
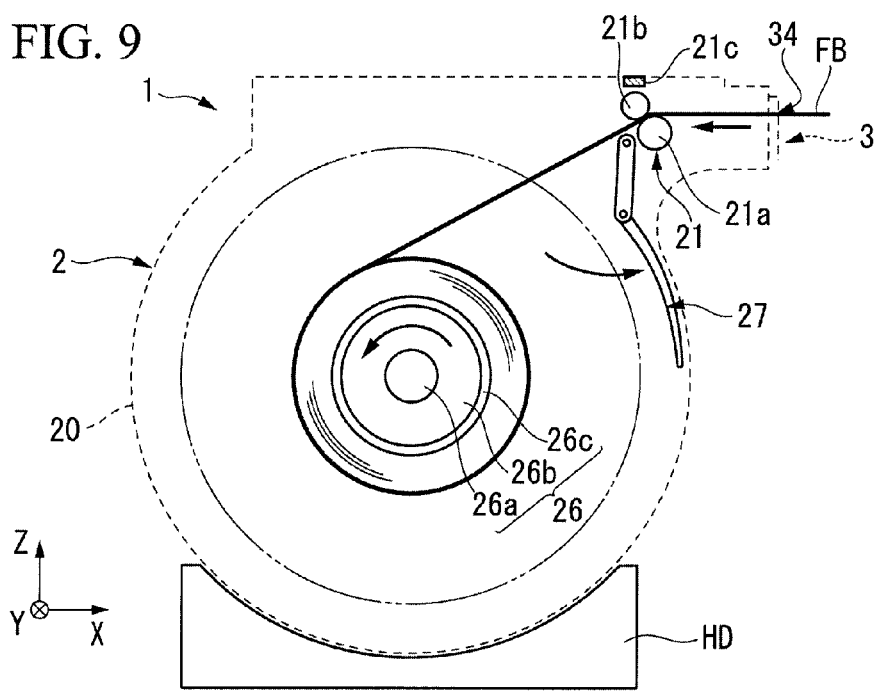
FIG. 9 is a diagram illustrating an operation of housing the substrate cartridge according to the embodiment.

Next, a housing operation for housing the sheet substrate FB in the substrate cartridge 1 configured as described above will be described. FIGS. 8 and 9 are diagrams illustrating the substrate cartridge 1 states when an operation of housing the substrate cartridge is performed. In FIGS. 8 and 9, for easy determination of the figures, the outer form of the substrate cartridge 1 is denoted by dotted lines.

As illustrated in FIGS. 8 and 9, in order to house the sheet substrate FB in the substrate cartridge 1, the substrate cartridge 1 is held on a holder HD. In this state, the sheet substrate FB is inserted through the opening portion 34. In order to insert the sheet substrate FB, the tension roller 21*a* and the rotation shaft member 26*a* (roller portion 26) are in a rotated state.

The sheet substrate FB inserted through the opening portion 34 is guided to the conveying portion 21 by the substrate-guiding portion 22. In the conveying portion 21, the sheet substrate FB is conveyed to the housing portion 20 side while being inserted between the tension roller 21*a* and the measurement roller 21*b*. In accordance with the rotation of the measurement roller 21*b*, for example, the detection portion 21*c* detects the conveyance length of the sheet substrate FB.

The sheet substrate FB passing through the conveying portion 21 on the housing portion 20 side is guided while being bent in the −Z direction according to its weight. In this embodiment, since the guide portion 27 is disposed on the −Z side of the sheet substrate FB, the sheet substrate FB is guided to the roller portion 26 along the rotation member 27*a* and the tip end member 27*b* of the guide portion 27.

When the front end of the sheet substrate FB arrives at the bonding portion 26*c* of the roller portion 26, the front end of the sheet substrate FB and the bonding portion 26*c* are bonded together. When the roller portion 26 is rotated in this state, the sheet substrate FB is slowly bonded to the bonding portion 26*c*, and the sheet substrate FB is wound around the roller portion 26. After the sheet substrate FB is bonded to the bonding portion 26*c*, the sheet substrate FB is conveyed, for example, while the rotation speed of the tension roller 21*a* and the rotation speed of the rotation shaft member 26*a* are adjusted such that the sheet substrate FB is not bent between the roller portion 26 and the conveying portion 21.

After the sheet substrate FB is wound around the roller portion 26, for example, by one revolution, as illustrated in FIG. 9, the guide portion 27 retracted. By rotating the roller portion 26 in this state, the sheet substrate FB is slowly wound up around the roller portion 26. While the thickness of the wound sheet substrate FB gradually increases, the guide portion 27 has already retracted, and accordingly, the sheet substrate FB and the guide portion 27 are avoided from being into contact with each other.

After the sheet substrate FB of a desired length is wound up, for example, the outer portion of the opening portion 34 of the sheet substrate FB is cut off. As above, the sheet substrate FB is housed in the substrate cartridge 1. During the operation of housing the sheet substrate FB, for example, the entire length of the sheet substrate FB housed inside the substrate cartridge 1 may be calculated based on the measured length of the sheet substrate FB that is measured by the detection portion 21*c*. In addition, the calculation result may be displayed on the display portion 29. Furthermore, the calculation result may be displayed on the display portion 29, be stored in the memory portion MR, or may be transmitted by using the communication portion CR.

In addition, for example, an operator may perform the winding of the sheet substrate FB while observing the inside of the housing portion 20 through the window portion 28. In such a case, the winding operation can be performed while checking, for example, whether or not the sheet substrate FB is wound in a bent state or whether or not the wound shape (roll shape) of the sheet substrate FB is in a distorted state, and accordingly, the winding-up can be immediately stopped in a case where an abnormality occurs.

(Operation of Substrate-Processing Apparatus)

Next, the operation of the substrate-processing apparatus 100 configured as described above will be described.

In this embodiment, a connection operation of connecting the substrate cartridge 1 housing the sheet substrate FB as the substrate-supplying unit 101 to the supply-side connection portion 102A, a sheet substrate FB-supplying operation performed through the substrate cartridge 1 by using the substrate-supplying unit 101, an element-forming operation by using the substrate-processing unit 102, and an operation of detaching the substrate cartridge 1 are sequentially performed.

Figure 10:
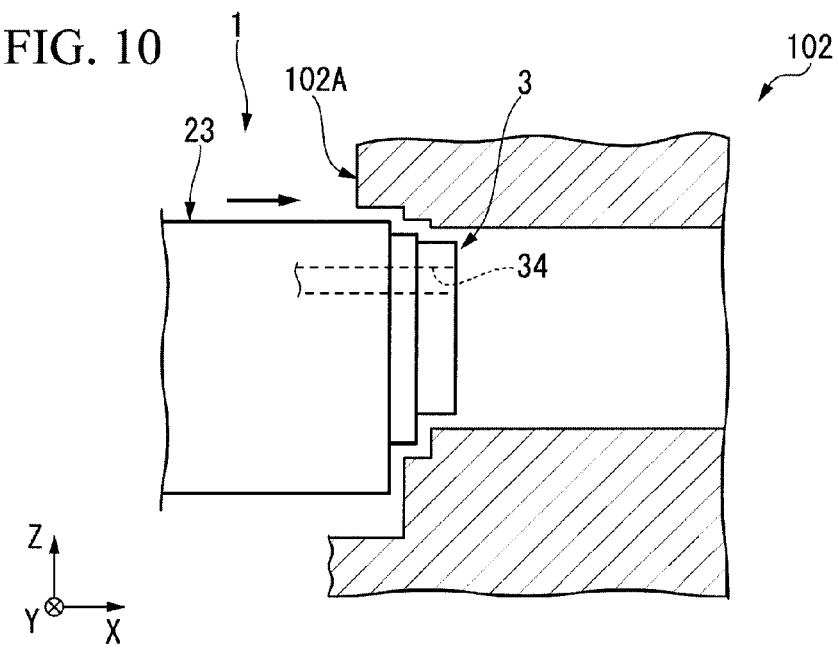
FIG. 10 is a diagram illustrating a connection operation of the substrate cartridge according to the embodiment.

First, a connection operation of the substrate cartridge 1 will be described. FIG. 10 is a diagram illustrating the connection operation of the substrate cartridge 1.

As illustrated in FIG. 10, in the supply-side connection portion 102A, an insertion opening is formed in a shape corresponding to the mounting unit 3.

In the connection operation, position alignment of the mounting unit 3 and the supply-side connection portion 102A is performed in the state in which the substrate cartridge 1 is held by the holder (for example, the same configuration as that of the holder HD illustrated in FIGS. 8 and 9). After the position alignment is performed, the mounting unit 3 is moved to the +X side so as to be inserted into the substrate-processing unit 102.

At this time, the terminal 3C of the mounting unit 3 and the apparatus-side terminal 102C of the supply-side connection portion 102A are brought into contact with each other. By bringing the terminal 3C and the apparatus-side terminal 102C into contact with each other, information is transmitted and received between the information-maintaining section IC of the substrate cartridge 1 and the communication portion 104CR of the control section 104. In accordance with the communication operation, the control section 104 reads out information (for example, the identification information, the specification information, or the like) maintained in the information-maintaining section IC of the substrate-supplying unit 101. The control section 104 determines a process ID in correspondence with the specification information out of read-out information, selects a combination of unit processes corresponding to the process ID from the second table Tb2, and performs the selected unit processes through each operation (the supply operation, the element-forming operation, and the like) presented below. In accordance with this operation, the unit processes are changed in accordance with the specification values of the sheet substrate FB as a processing target, and accordingly, an optimal operation process of the sheet substrate FB is performed. In addition, by writing the specification information and the like read out from the substrate-supplying unit 101 into the information-maintaining section IC of the substrate-recovering unit 103, the control section 104 may deliver the specification information of the substrate-supplying unit 101 to the substrate-recovering unit 103. In addition, the control section 104 may deliver the information relating to the selected unit processes to the substrate-recovering unit 103 based on the above-described specification information. In such a case, since the control section 104 delivers the information that is based on each unit process performed for the sheet substrate FB by the substrate-processing unit 102 to the substrate-recovering unit 103, the substrate-recovering unit 103 can maintain process progress information such as the processes performed for the sheet substrate FB as the specification information.

In addition, before the connection operation of the substrate cartridge 1, the information-maintaining section IC may deliver the above-described information to the control section 104 through wireless communication performed between the communication portion CR of the information-maintaining section IC and the communication portion 104CR of the control section 104.

Figure 11:
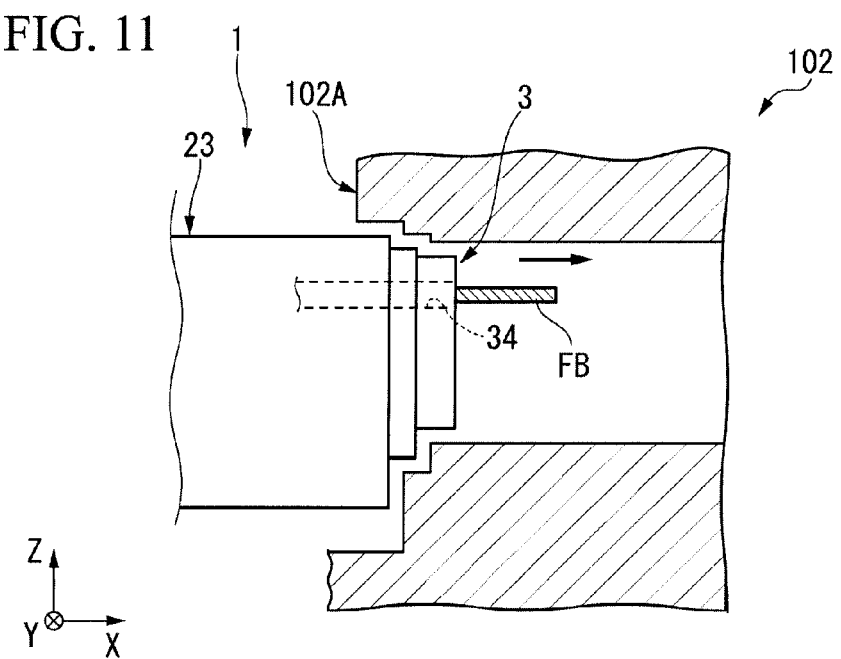
FIG. 11 is a diagram illustrating a connection operation of the substrate cartridge according to the embodiment.

Next, the supply operation will be described. In order to supply the sheet substrate FB to the substrate-processing unit 102, for example, the rotation shaft member 26a (the roller portion 26) of the substrate cartridge 1 and the tension roller 21a are rotated in a direction opposite to that at the time of the housing operation. As illustrated in FIG. 11, the sheet substrate FB is sent out through the opening portion 34.

Next, the element-forming operation will be described. In the element-forming operation, as illustrated in FIG. 2, elements are formed on the sheet substrate FB by the substrate-processing unit 102 while the sheet substrate FB is supplied from the substrate-supplying unit 101 to the substrate-processing unit 102. In the substrate-processing unit 102, as illustrated in FIG. 3, the sheet substrate FB is conveyed by the roller RR.

The control section 104, in addition to the above-described combination of the unit processes, may control the operation of the substrate-processing unit 102 based on the process information supplied from the substrate cartridge 1. For example, the control section 104 may adjust the rotation speed of each roller RR located inside the substrate-processing unit 102 in accordance with the supply speed of the sheet substrate FB supplied from the substrate cartridge 1. In addition, the control section 104 detects whether or not the roller RR is deviated in the Y axis direction and corrects the position by moving the roller RR in a case where there is a deviation. Furthermore, the control section 104 additionally performs the correction of the position of the sheet substrate FB.

The sheet substrate FB supplied from the substrate-supplying unit 101 to the substrate-processing unit 102, first, is conveyed to the partition wall-forming portion 91. In the partition wall-forming portion 91, the sheet substrate FB is pressed while being interposed between the imprint roller 110 and the thermal transfer roller 115, and partition walls BA and alignment marks AM are formed on the sheet substrate through heat transfer.

Figure 12:
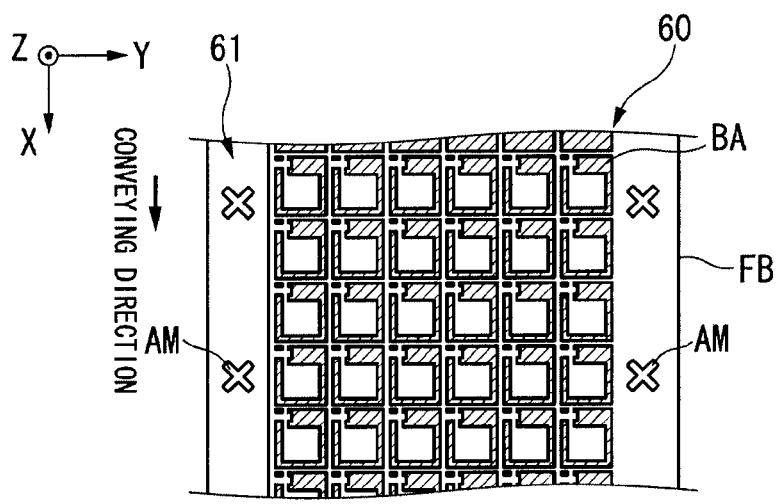
FIG. 12 is a diagram illustrating a partition wall-forming process of the substrate-processing unit according to the embodiment.
Figure 13:
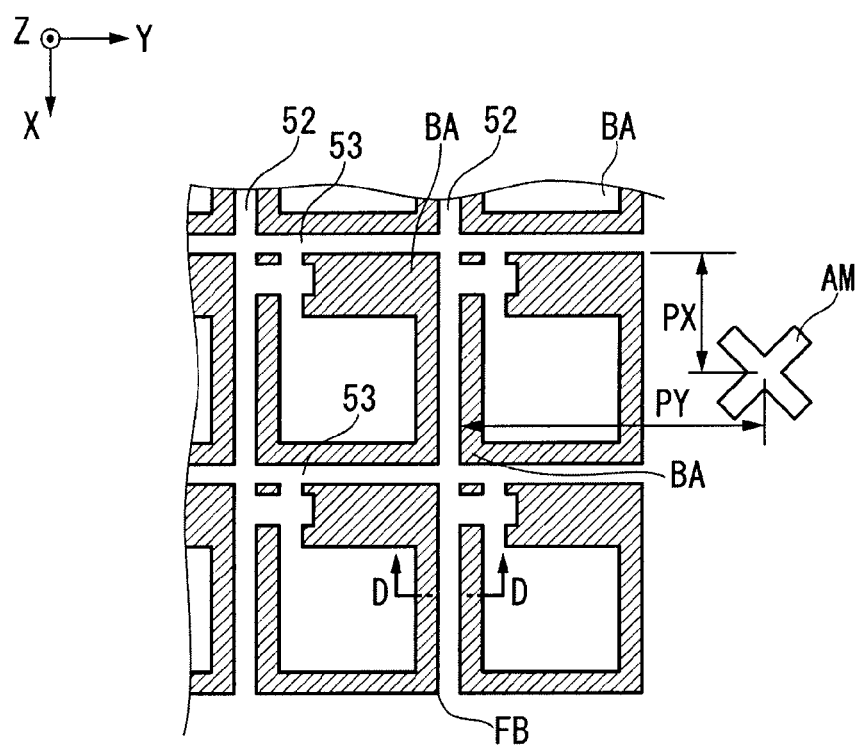
FIG. 13 is a diagram illustrating the shape and the arrangement of partition walls formed on a sheet substrate according to the embodiment.
Figure 14:
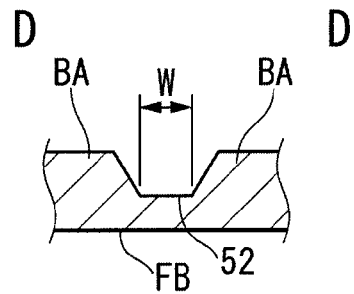
FIG. 14 is a cross-sectional view of the partition walls formed on the sheet substrate according to the embodiment.

FIG. 12 is a diagram illustrating a state in which the partition walls BA and the alignment marks AM are formed on the sheet substrate FB. FIG. 13 is a diagram acquired by partially enlarging FIG. 12. FIG. 14 is a diagram illustrating the configuration taken along line D-D shown in FIG. 13. FIGS. 12 and 13 illustrate the appearance when the sheet substrate FB is viewed from the +Z side.

As illustrated in FIG. 12, the partition wall BA is formed in an element-forming area 60 located in the center portion of the sheet substrate FB in the Y direction. As illustrated in FIG. 13, by forming the partition walls BA, in the element-forming area 60, an area (gate-forming area 52) in which the gate bus line GBL and the gate electrode G are formed and an area (a source-drain-forming area 53) in which the source bus line SBL, the source electrode S, the drain electrode D, and the anode P are formed are partitioned. As illustrated in FIG. 14, the gate-forming area 52 is formed in a trapezoidal shape in the cross-sectional view. Although not illustrated in the figure, the source-drain-forming area 53 has a shape similar thereto. The width W (μm) inside the partition wall BA is the line width of the gate bus line GBL. It is preferable that the width W be about two to four times of the diameter d (μm) of liquid droplets used for coating from the liquid droplet-coating apparatus 120G.

In addition, for easy peel-off of the sheet substrate FB after pressing of the imprint mold 11 for the sheet substrate FB, it is preferable that the cross-sectional shapes of the gate-forming area 52 and the source-drain-forming area 53 be in a "V" or "U" shape in the cross-sectional view. As another shape, for example, the cross-sectional shapes thereof may be a rectangle in the cross-sectional view.

As illustrated in FIG. 12, one pair of the alignment marks AM are formed in the edge areas 61 located on both end portions of the sheet substrate FB in the Y direction. Since a mutual positional relationship between the partition wall BA and the alignment mark AM is important, the partial wall BA and the alignment mark AM are simultaneously formed. As illustrated in FIG. 13, a predetermined distance PY between the alignment mark AM and the gate-forming area 52 is defined in the Y axis direction, and a predetermined distance PX between the alignment mark AM and the source-drain-forming area 53 is defined in the X axis direction. Accordingly, the deviation of the sheet substrate FB in the X axis direction, the deviation thereof in the Y axis direction, and the rotation θ can be detected based on the positions of the one pair of alignment marks AM.

In FIGS. 12 and 13, although one pair of the alignment marks AM are disposed for each partition wall BA of a plurality of rows in the X axis direction, the present invention is not limited thereto, and, for example, the alignment mark AM may be arranged for each row of the partition walls BA1. In addition, in a case where there is a space, the alignment mark AM may be disposed not only in the edge area 61 of the sheet substrate FB but also in the element-forming area 60. Furthermore, in FIGS. 12 and 13, although the shape of the alignment mark AM is a cross shape, a shape such as a circular mark, a tilted straight line mark or the like may be used.

Subsequently, the sheet substrate FB is conveyed to the electrode-forming portion 92 by the conveying roller RR. In the electrode-forming portion 92, coating using liquid droplets is performed by each liquid droplet-coating apparatus 120, whereby electrodes are formed on the sheet substrate FB.

Figure 15A:
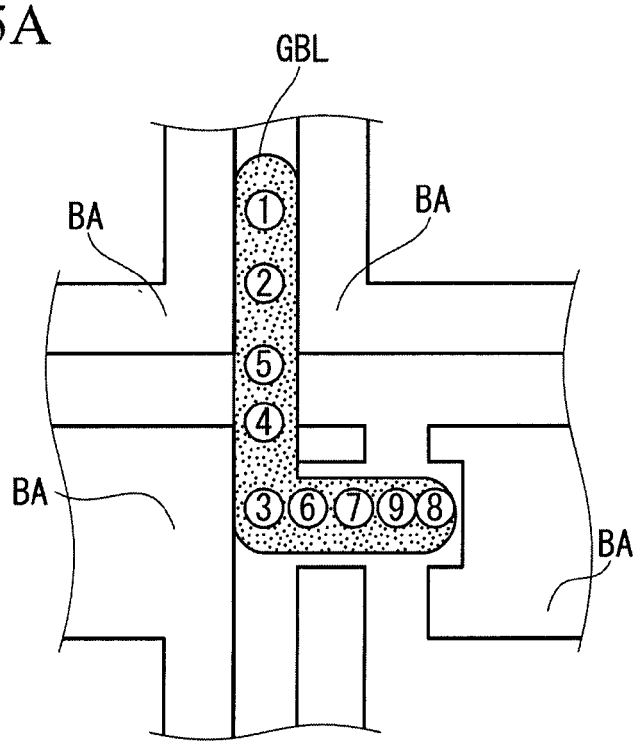
FIG. 15A is a diagram illustrating a liquid droplet-coating operation according to the embodiment.
Figure 15B:
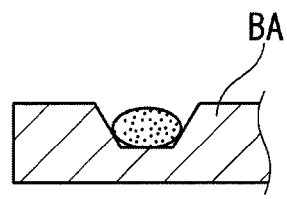
FIG. 15B is a diagram illustrating a liquid droplet-coating operation according to the embodiment.

On the sheet substrate FB, first, the gate bus line GBL and the gate electrode G are formed by the liquid droplet-coating apparatus 120G. FIGS. 15A and 15B are diagrams illustrating the appearances of the sheet substrate FB for which liquid droplet coating is performed by the liquid droplet-coating apparatus 120G.

As illustrated in FIG. 15A, the liquid droplet-coating apparatus 120G coats the gate-forming area 52 of the sheet substrate FB on which the partition walls BA are formed with metal ink, for example, in the order of 1 to 9. This order is an order in which, for example, coating is performed in a linear pattern due to the tension of the metal ink. FIG. 15B is a diagram illustrating a state in which, for example, coating is performed by using one droplet of metal ink. As illustrated in FIG. 15B, since the partition walls BA are disposed, the metal ink with which the gate-forming area 52 is coated does not diffuse but is maintained. As above, the entire gate-forming area 52 is coated with the metal ink.

Figure 16A:
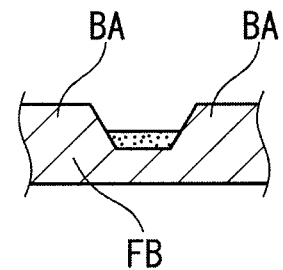
FIG. 16A is a diagram illustrating the configuration of a thin film formed between the partition walls according to the embodiment.
Figure 16B:
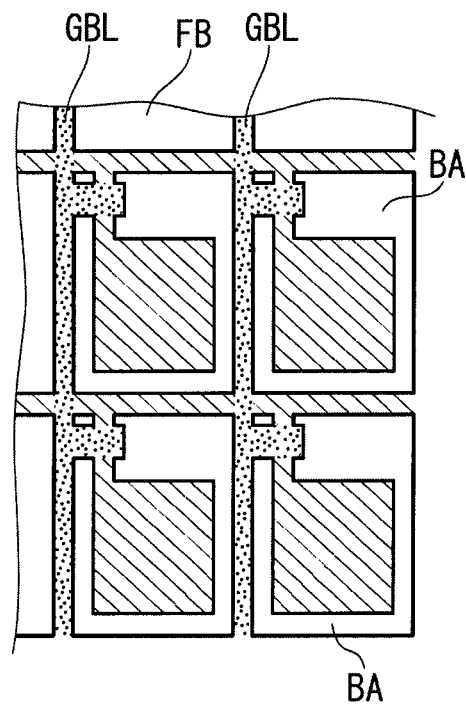
FIG. 16B is a diagram illustrating the configuration of a thin film formed between the partition walls according to the embodiment.

After the gate-forming area 52 is coated with metal ink, the sheet substrate FB is conveyed such that the portion coated with the metal ink is located on the −Z side of the thermal treatment apparatus BK. The thermal treatment apparatus BK performs a thermal treatment for the metal ink with which the sheet substrate FB is coated on the upper side, thereby drying the metal ink. FIG. 16A is a diagram illustrating the state of the gate-forming area 52 after drying the metal ink. As illustrated in FIG. 16A, by drying the metal ink, conductive bodies contained in the metal ink are laminated in a thin film state. The conductive bodies in such a thin film state are formed in the entire gate-forming area 52, and, as illustrated in FIG.

16B, the gate bus line GBL and the gate electrode G are formed on the sheet substrate FB.

Figure 17:
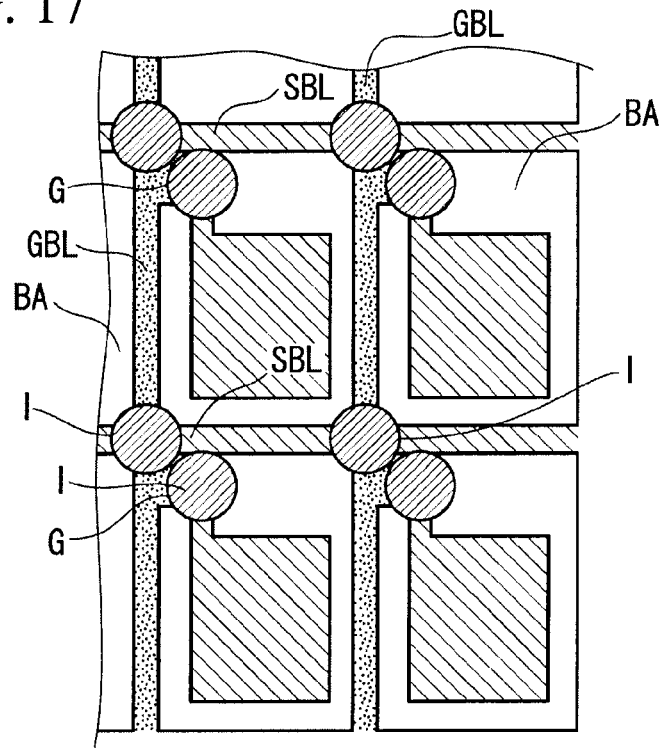
FIG. 17 is a diagram illustrating a process of forming a gate-insulating layer on the sheet substrate according to the embodiment.

Next, the sheet substrate FB is conveyed to the −Z side of the liquid droplet-coating apparatus 120I. In the liquid droplet-coating apparatus 120I, the sheet substrate FB is coated with an electrically insulating ink. In the liquid droplet-coating apparatus 120I, for example, as illustrated in FIG. 17, each of the upper side of the gate bus line GBL and the gate electrode G passing through the source-drain-forming area 53 are coated with the electrically insulating ink.

After the coating is performed by using the electrically insulating ink, the sheet substrate FB is conveyed to the −Z side of the thermal treatment apparatus BK, and a thermal treatment is performed for the electrically insulating ink by the heat treatment apparatus BK. In accordance with the thermal treatment, the electrically insulating ink is dried, whereby the gate-insulating layer I is formed. In FIG. 17, although a state is illustrated in which the gate-insulating layer I is formed in a circular shape so as to extend over the partition wall BA, the gate-insulating layer does not particularly need to be formed over the partition wall BA.

Figure 18:
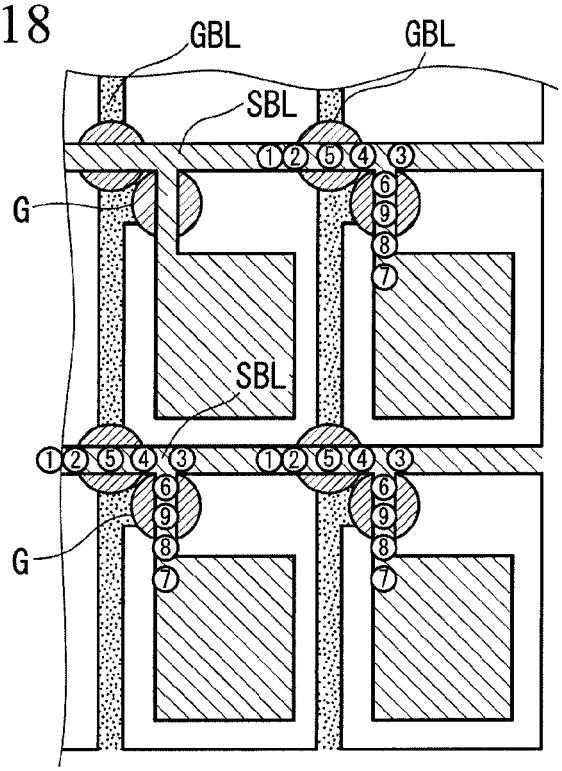
FIG. 18 is a diagram illustrating a process of cutting off wirings of the sheet substrate according to the embodiment.

After the gate-insulating layer I is formed, the sheet substrate FB is conveyed to the −Z side of the liquid droplet-coating apparatus 120SD. In the liquid droplet-coating apparatus 120SD, the source-drain-forming area 53 of the sheet substrate FB is coated with metal ink. To a portion of the source-drain-forming area 53 that exceeds the gate-insulating layer I, for example, the metal ink is discharged, for example, in the order of 1 to 9 shown in FIG. 18.

After the discharge of the metal ink, the sheet substrate FB is conveyed to the −Z side of the heat treatment apparatus BK, and a drying process for the metal ink is performed. After the drying process is performed, conductive bodies contained in the metal ink are laminated in a thin film state, whereby the source bus line SBL, the source electrode S, the drain electrode D, and the anode P are formed. In this step, a state is formed in which the source electrode S and the drain electrode D are connected to each other.

Figure 19:
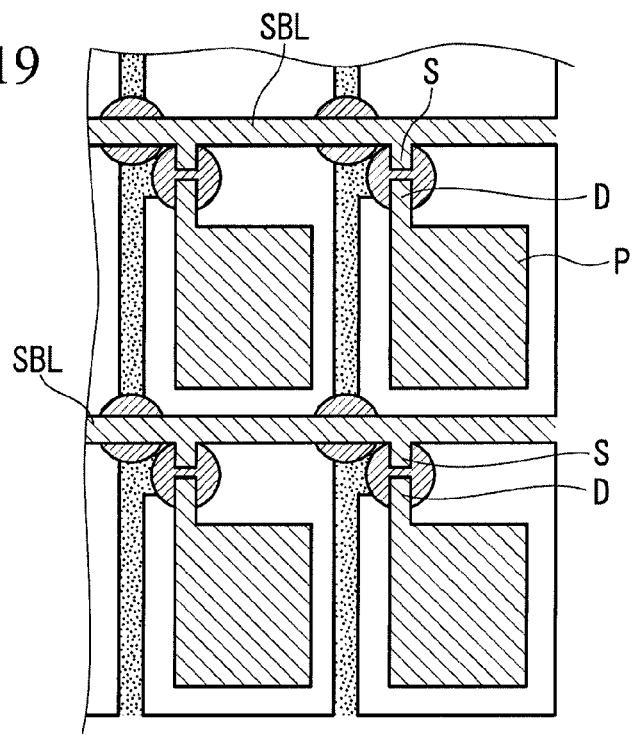
FIG. 19 is a diagram illustrating a process of forming a thin film in a source-drain-forming region according to the embodiment.

Next, the sheet substrate FB is conveyed to the −Z side of the cutting apparatus 130. The sheet substrate FB is cut by the cutting apparatus 130 between the source electrode S and the drain electrode D. FIG. 19 is a diagram illustrating a state in which a gap between the source electrode S and the drain electrode D is cut off by the cutting apparatus 130. In the cutting apparatus 130, cutting is performed while adjusting the emission position of the laser light LL on the sheet substrate FB by using the galvanometer mirror 131.

After cutting between the source electrode S and the drain electrode D is performed, the sheet substrate FB is conveyed to the −Z side of the liquid droplet-coating apparatus 120OS. An organic semiconductor layer OS is formed on the sheet substrate FB by the liquid droplet-coating apparatus 120OS. Organic semiconductor ink is discharged to an area located on the sheet substrate FB that overlaps the gate electrode G over the source electrode S and the drain electrode D.

Figure 20:
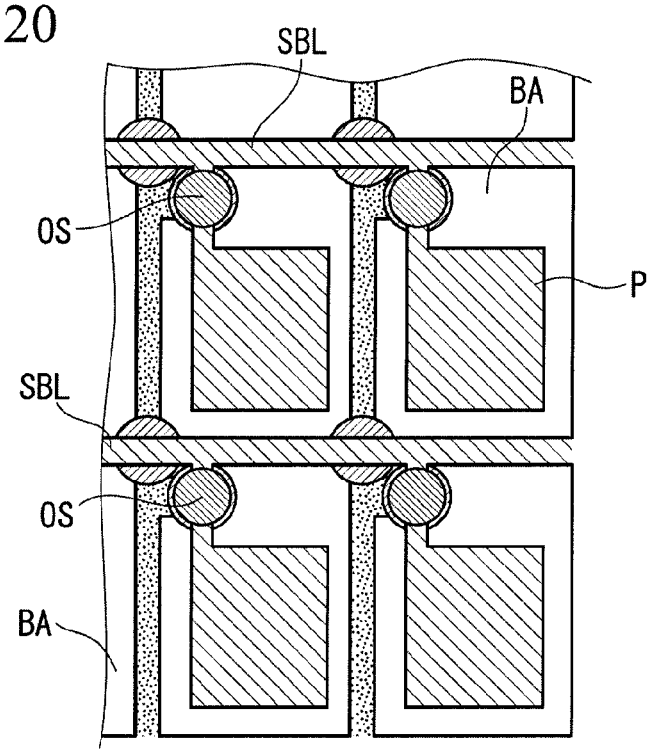
FIG. 20 is a diagram illustrating a process of forming an organic semiconductor layer according to the embodiment.

After the discharge of the organic semiconductor ink, the sheet substrate FB is conveyed to the −Z side of the thermal treatment apparatus BK, and a drying process is performed for the organic semiconductor ink. After the drying process, a semiconductor contained in the organic semiconductor ink is laminated in a thin film state, and, as illustrated in FIG. 20, an organic semiconductor OS is formed. According to the above-described process, field-effect transistors and connection wirings are formed on the sheet substrate FB.

Subsequently, the sheet substrate FB is conveyed to the light-emitting layer-forming portion 93 by the conveying roller RR (see FIG. 3). In the light-emitting layer-forming portion 93, light-emitting layers IR of red, green, and blue are formed by the liquid droplet-coating apparatus 140Re, the liquid droplet-coating apparatus 140Gr, and the liquid droplet-coating apparatus 140Bl and the thermal treatment apparatus BK. Since the partition walls BA are formed on the sheet substrate FB, even in a case where the light-emitting layers IR of red, green, and blue are continuously coated without performing a thermal treatment by using the thermal treatment apparatus BK, there is no occurrence of a mixed color due to overflowing of solutions into adjacent pixel areas.

After the formation of the light-emitting layers IR, an insulating layer I is formed in the sheet substrate FB through the liquid droplet-coating apparatus 140I and the thermal treatment apparatus BK, and a transparent electrode IT is formed through the liquid droplet-coating apparatus 140IT and the thermal treatment apparatus BK. Through such a process, the organic EL element 50 illustrated in FIG. 1 is formed on the sheet substrate FB.

Figure 21:
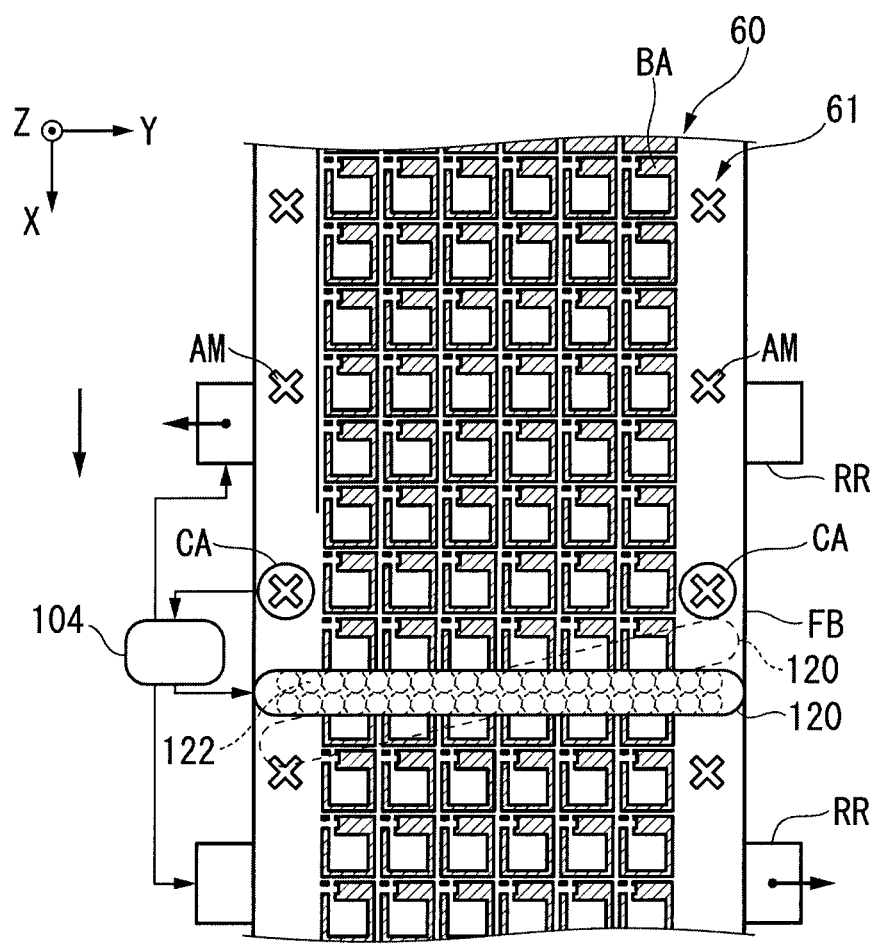
FIG. 21 is a diagram illustrating an example of alignment according to the embodiment.

In the element-forming operation, in the process of forming the organic EL element 50 while conveying the sheet substrate FB as above, in order to prevent the occurrence of deviations of the sheet substrate FB in the X direction, the Y direction, and the θZ direction, an alignment operation is performed. Hereinafter, the alignment operation will be described with reference to FIG. 21.

In the alignment operation, a plurality of alignment cameras CA (CA1 to CA8) disposed in each portion appropriately detects the alignment marks AM formed on the sheet substrate FB and transmits the detection results to the control section 104. The control section 104 performs the alignment operation based on the transmitted detection results.

For example, the control section 104 detects the transfer speed of the sheet substrate FB based on the imaging intervals of the alignment marks AM detected by the alignment cameras CA (CA1 to CA8) and the like and determines whether the roller RR is rotated, for example, at a predetermined speed. In a case where it is determined that the roller RR does not rotate at the predetermined speed, the control section 104 applies feedback by issuing an instruction for adjustment of the rotation speed of the roller RR.

In addition, for example, the control section 104 detects whether or not there is a positional deviation of the alignments AM in the Y axis direction based on the imaging results of the alignment marks AM and detects whether or not there is the positional deviation of the sheet substrate FB in the Y axis direction. In a case where the positional deviation is detected, the control section 104 detects whether or not the positional deviation is continued for some degree of time in the state in which the sheet substrate FB is conveyed.

When a case where the time during which the positional deviation occurred was a short time, it is corresponded by changing a nozzle 122, which performs coating of liquid droplets, out of a plurality of nozzles 122 of the liquid droplet-coating apparatus 120. In a case where the deviation of the sheet substrate FB in the Y axis direction is continued for a long time, the position of the sheet substrate FB in the Y axis direction is corrected by moving the roller RR.

In addition, for example, the control section 104 detects whether or not there is a deviation of the sheet substrate FB in the θZ direction based on the positions of the alignment marks AM, which are detected by the alignment cameras CA, in the X axis and Y axis directions. In a case where a positional deviation is detected, the control section 104, similarly to a case where a positional deviation in the Y axis direction is detected, detects how long the positional deviation has continued in the state in which the sheet substrate FB is conveyed.

When a case where the time during which the positional deviation occurred was a short time, it is corresponded by changing a nozzle 122, which performs coating of liquid droplets, out of a plurality of nozzles 122 of the liquid droplet-coating apparatus 120. In a case where the deviation is continued for a long time, the position of the sheet substrate FB in the θZ direction is corrected by moving two rollers RR, which are disposed at positions with the alignment camera CA that has detected the deviation interposed therebetween, in the X direction or the Y direction.

Next, the detachment operation will be described. For example, after the organic EL element 50 is formed on the sheet substrate FB, and the sheet substrate FB is recovered, the substrate cartridge 1 used as the substrate-supplying unit 101 is detached from the substrate-processing unit 102.

Figure 22:
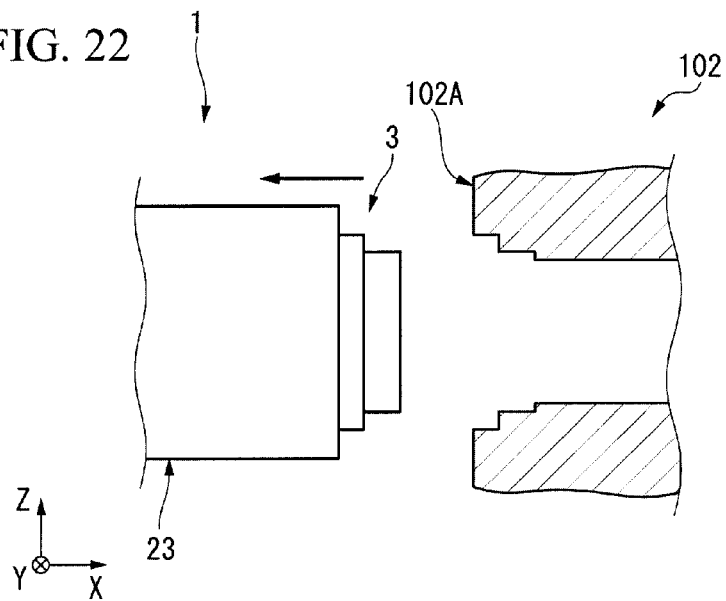
FIG. 22 is a diagram illustrating an operation of detaching the substrate cartridge according to the embodiment.

FIG. 22 is a diagram illustrating the operation of detaching the substrate cartridge 1.

As illustrated in FIG. 22, in the detachment operation, the mounting unit 3 is moved in the −X direction so as to be excluded from the supply-side connection portion 102A, and the mounting unit 3 is excluded. In this operation, the mounting unit 3 is deviated along the guidance of the supply-side connecting portion 102A.

As above, according to this embodiment, since the substrate cartridge 1 includes the cartridge main body 2 that houses the sheet substrate FB and the information-maintaining section IC maintaining information that includes at least specification information relating to the specification values of the sheet substrate FB that is housed in the cartridge main body 2, for example, the control section 104 can determine the specification values of the sheet substrate FB and the like by using the specification information of the sheet substrate FB housed in the cartridge main body 2 and the like. Accordingly, the process for the substrate is efficiently performed. In addition, the information managing capability of the entire manufacturing line including the sheet substrate FB is improved.

In addition, according to this embodiment, the substrate-processing apparatus 100 includes the substrate-processing unit 102 that processes the sheet substrate FB, the substrate-supplying unit 101 that carries in the sheet substrate FB in the substrate-processing unit 102, the substrate-recovering unit 103 that carries out the substrate from the substrate-processing unit 102, and the substrate cartridge 1 is used as the substrate-supplying unit 101, and accordingly, the substrate-processing unit 102 can perform a process that is optimal for the sheet substrate FB by switching the process to the optimal process by using the information supplied from the substrate cartridge 1. Accordingly, in the substrate-processing unit 102, defects such as damage, deformation, and the like in the sheet substrate FB are reduced.

In addition, according to this embodiment, in the manufacturing process of the display element, a process of processing the sheet substrate FB by using the substrate-processing unit 102 and a process of supplying the sheet substrate FB to the substrate-processing unit 102 or recovering the sheet substrate FB from the substrate-processing unit 102 by using the substrate cartridge 1 are included, whereby the display element can be efficiently manufactured using the managing information at a high level.

Furthermore, according to this embodiment, for example, the control section 104 can update information such as the specification information that is maintained in the information-maintaining section IC of the substrate cartridge 1, whereby the substrate cartridge 1 used as the substrate-supplying unit 101 can be recycled.

Second Embodiment

Next, a second embodiment of the present invention will be described.

Figure 23:
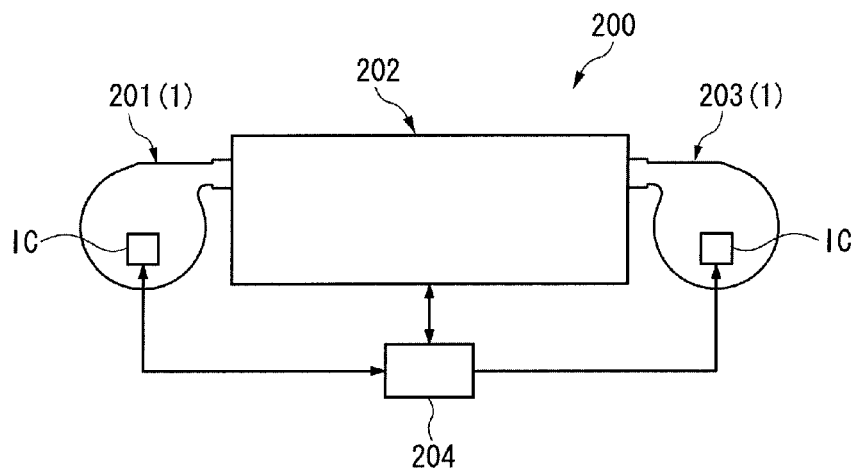
FIG. 23 is a diagram illustrating the configuration of a substrate-processing apparatus according to a second embodiment of the present invention.

FIG. 23 is a diagram illustrating the configuration of the substrate-processing apparatus 200 according to this embodiment.

As illustrated in FIG. 23, the substrate-processing apparatus 200 includes a substrate-supplying unit 201, a substrate-processing unit 202, a substrate-recovering unit 203, and a control unit 204. In this embodiment, the above-described substrate cartridge 1 is used both in the substrate-supplying unit 201 and the substrate-recovering unit 203, which is different from the first embodiment.

The substrate-processing unit 202 has a configuration in which, for example, the substrate-cutting section 108 is not disposed in the substrate-processing unit 102 according to the first embodiment. Accordingly, the sheet substrate FB processed by the substrate-processing unit 202 is recovered by the substrate-recovering unit 203 in the state of not being cut but being a sheet shape.

In addition, for example, the configuration in which the specification information of the sheet substrate FB and the process information, and the identification information of the substrate cartridge 1 are maintained in the substrate cartridge 1, the configuration in which the first table Tb1 and the second table Tb2 are arranged in the control unit 204, the configuration in which the information-maintaining section IC and the control unit 204 are communicable with each other, and the like are similar to those described in the first embodiment.

Figure 24:
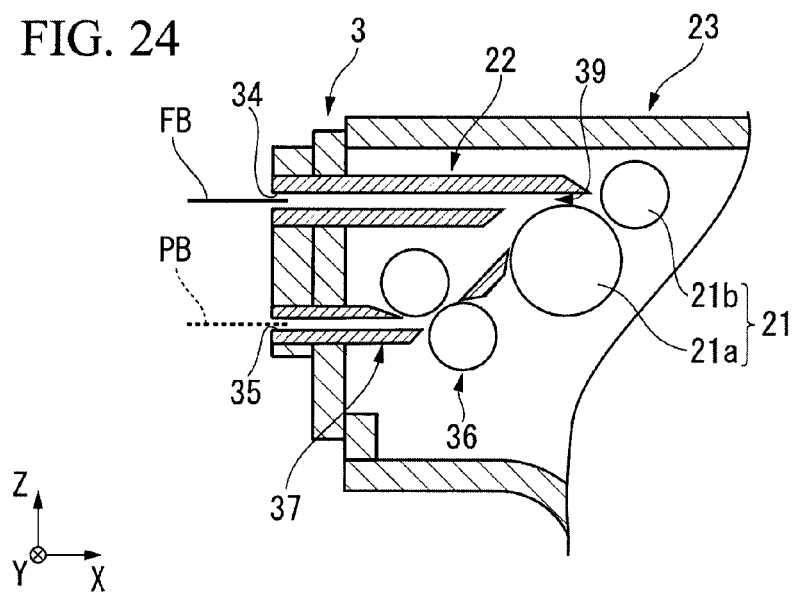
FIG. 24 is a diagram illustrating an operation of recovering a sheet substrate FB according to the embodiment.
Figure 25:
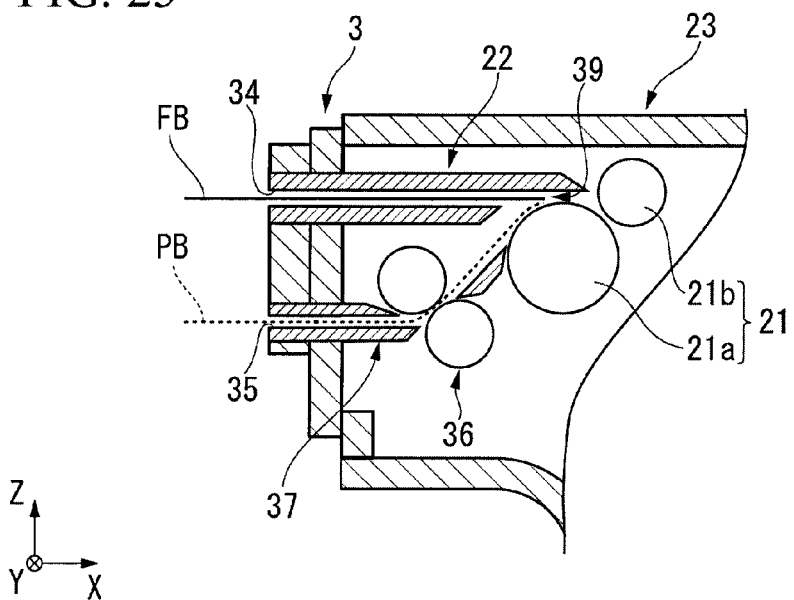
FIG. 25 is a diagram illustrating an operation of recovering the sheet substrate FB according to the embodiment.
Figure 26:
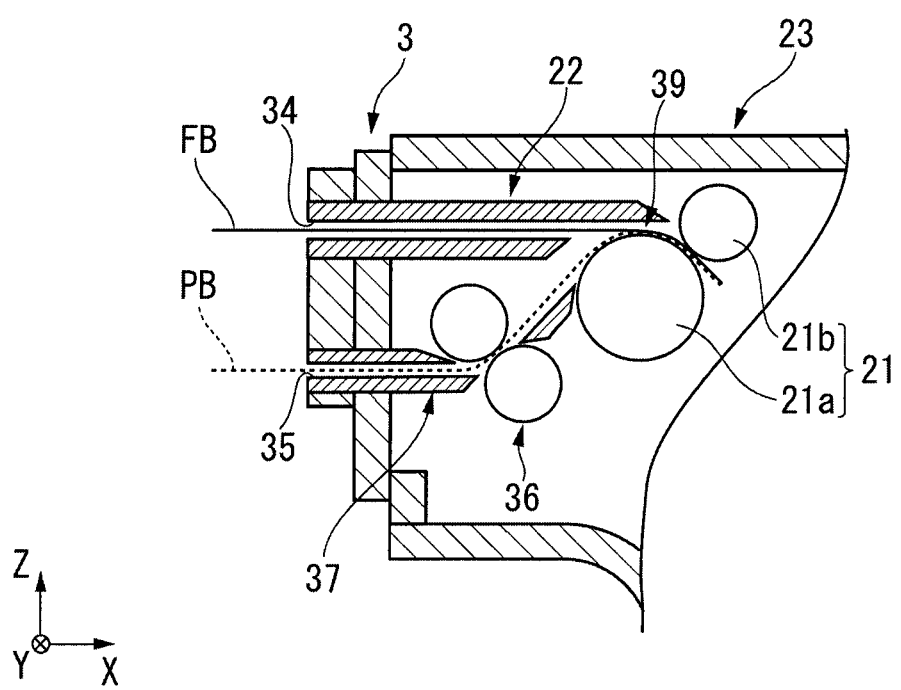
FIG. 26 is a diagram illustrating an operation of recovering the sheet substrate FB according to the embodiment.

FIGS. 24 to 26 are diagrams illustrating the recovery of the sheet substrate FB in the substrate-recovering unit 103. In FIGS. 24 to 26, for easy determination of the figures, the configuration is represented in a state in which a part thereof is omitted.

In the recovery operation, as illustrated in FIG. 24, the sheet substrate FB is inserted into the opening portion 34 of the substrate cartridge 1, and the protective substrate PB is inserted from the second opening portion 35. The protective substrate PB, for example, is supplied from a protective substrate-supplying unit that is not illustrated in the figure.

The sheet substrate FB and the protective substrate PB that have been inserted, as illustrated in FIG. 25, are guided by the substrate-guiding portion 22 and the second substrate-guiding portion 37, thereby joining together in the joining portion 39. The sheet substrate FB and the protective substrate PB joined in the joining portion 39, as illustrated in FIG. 26, are conveyed by the conveying portion 21 in the state of being joined and are pressed by the tension roller 21a and the measurement roller 21b so as to be brought into tight contact with each other. The sheet substrate FB and the protective substrate PB are wound up by the roller portion 26 so as to be recovered in a tight contact state.

When the sheet substrate FB is recovered by the substrate-recovering unit 203, the control unit 204 transmits the specification information of the sheet substrate FB after processing and the process information corresponding to the specification information to the information-maintaining section IC of the substrate cartridge 1 used as the substrate-recovering unit 203. The information-maintaining section IC receives the transmitted information and stores the transmitted information in the memory portion MR.

As above, according to this embodiment, the substrate-processing apparatus 200 includes the substrate-processing unit 202 that processes the sheet substrate FB, the substrate-supplying unit 201 that carries the sheet substrate FB in the substrate-processing unit 202, and the substrate-recovering unit 203 that carries the substrate out from the substrate-processing unit 202, and the substrate cartridge 1 is used as the substrate-supplying unit 201 and the substrate-recovering unit 203, whereby the information transmitted from the substrate cartridge 1 is delivered to the substrate cartridge 1 of the recovery destination. Accordingly, even in a case where the substrate cartridge 1 of the recovery destination is managed, or the sheet substrate FB housed in the substrate cartridge 1 of the recovery destination is processed, the substrate-processing apparatus 200 can use the above-described information. Therefore, the information managing capability of the substrate-processing apparatus 200 can be improved, whereby the processing efficiency is markedly improved.

In this embodiment, although an example has been described in which the configuration of the substrate-processing unit 202 is the same as that of the substrate-processing unit 102 described in the first embodiment, the present invention is not limited thereto. For example, in the substrate-processing unit 202, a configuration may be employed in which only some of the partition wall-forming portion 91, the electrode-forming portion 92, and the light-emitting layer-forming portion 93 that configure the substrate-processing unit 102 described in the first embodiment are disposed.

For example, a configuration will be described as an example in which only the partition wall-forming portion 91 is disposed as the substrate-processing unit 202, but the electrode-forming portion 92 and the light-emitting layer-forming portion 93 are not disposed. In such a case, in a state in which only the partition walls BA are formed by the substrate-processing unit 202, the sheet substrate FB is recovered by the substrate-recovering unit 203. For the sheet substrate FB that is recovered by the substrate-recovering unit 203, an electrode-forming process and a light-emitting layer forming process are performed by another substrate-processing unit.

Since the substrate cartridge 1 is disposed so as to be attachable/detachable to or from the substrate-processing unit 202, in such a case, the substrate cartridge 1 can be detached from the substrate-processing unit 202, and the substrate cartridge 1 can be conveyed and connected to another substrate-processing unit. In the information-maintaining section IC of the substrate cartridge 1, information including the specification information of the sheet substrate FB, the process information, and the identification information of the substrate cartridge 1 is maintained, and accordingly, the process can be performed by the substrate-processing unit of the connection destination by using the information. As above, even in a case where a plurality of the substrate-processing units is passed over in one manufacturing line, and communication of information between the substrate-processing units is not performed, the information of the sheet substrate FB can be delivered through the substrate cartridge 1. Even in such a case, the information managing capability can be improved, whereby the processing efficiency is markedly improved.

Third Embodiment

Figure 27:
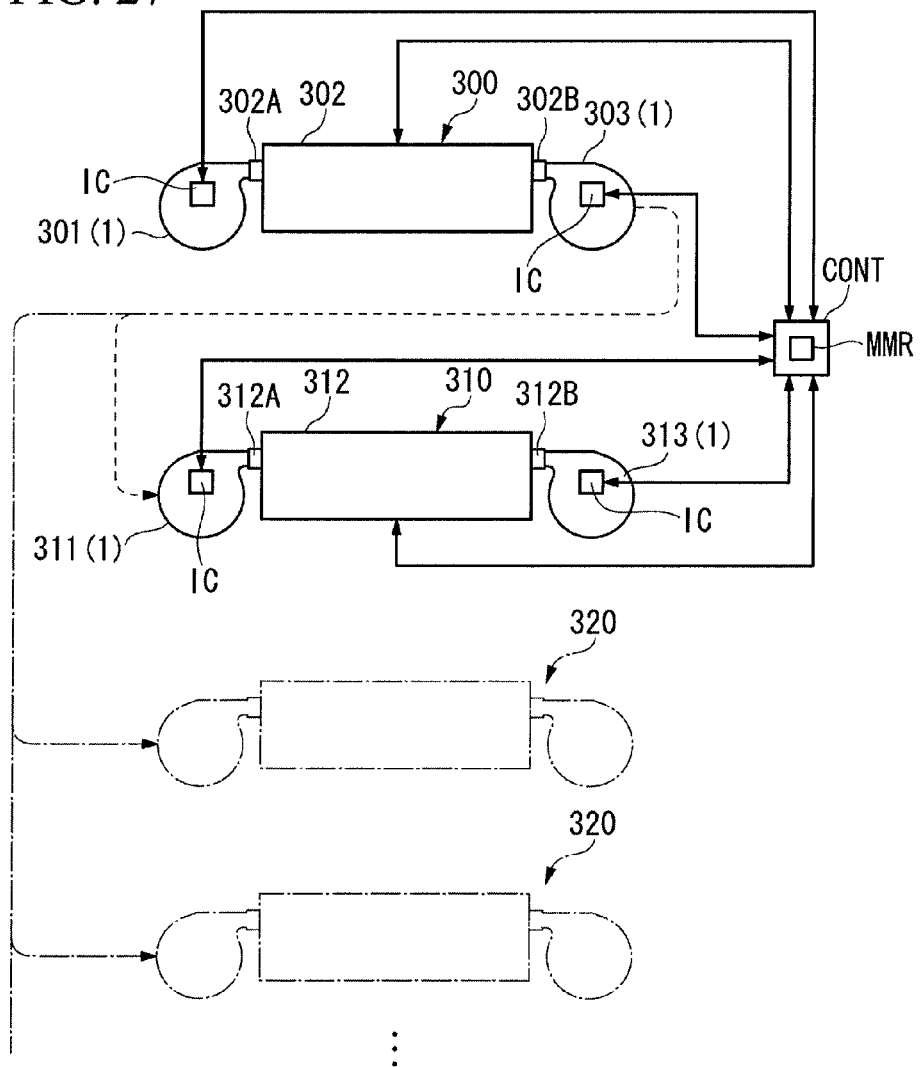
FIG. 27 is a diagram illustrating the configuration of a substrate-processing system according to a third embodiment of the present invention.

Next, a third embodiment of the present invention will be described.
In this embodiment, a case will be described as an example in which a plurality of the substrate-processing units communicates with each other for information.
FIG. 27 is a diagram illustrating a substrate-processing system SYS according to this embodiment.

As illustrated in FIG. 27, the substrate-processing system SYS includes a first substrate-processing apparatus 300, a second substrate-processing apparatus 310, and a main control apparatus CONT. For example, the first substrate-processing apparatus 300 and the second substrate-processing apparatus 310 are disposed within the same site or within the same factory.

The first substrate-processing apparatus 300, for example, is an apparatus that forms the partition walls BA of the organic EL element 50 on the sheet substrate FB. The second substrate-processing apparatus 310, for example, is an apparatus that forms electrodes (a gate electrode G and the like), the light-emitting layer IR of the organic EL element 50, and the transparent electrode ITO on the sheet substrate FB. As above, in the substrate-processing system SYS, the apparatus that forms the organic EL element 50 is configured to be divided into two types of apparatuses including the first substrate-processing apparatus 300 and the second substrate-processing apparatus 310.

The first substrate-processing apparatus 300 includes a substrate-supplying unit 301, a substrate-processing unit 302, and a substrate-recovering unit 303. In this embodiment, the above-described substrate cartridge 1 is used as the substrate-supplying unit 301 and the substrate-recovering unit 303.

The substrate-processing unit 302 has the same configuration as that of the partition wall-forming portion 91 of the substrate-processing apparatus 100 according to the first embodiment, and, in a connection portion of the substrate-processing unit 302 for the substrate-supplying unit 301, a supply-side connection portion 302A is disposed. The configuration of the supply-side connection portion 302A is the same as that of the supply-side connection portion 102A according to the first embodiment. As above, the first substrate-processing apparatus 300 has the same configuration as that of the substrate-supplying unit 101 of the substrate-processing apparatus 100 to the partition wall-forming portion 91 of the substrate-processing unit 102 in the first embodiment.

In a connection portion of the substrate-processing unit 302 for the substrate-recovering unit 303, a recovery-side connection portion 302B that is connected to the mounting unit 3 of the substrate cartridge 1 is disposed. The recovery-side connection portion 302B has the same configuration as that of the supply-side connection portion 302A.

The second substrate-processing apparatus 310 includes a substrate-supplying unit 311, a substrate-processing unit 312, and a substrate-recovering unit 313, and each unit has the same configuration as that of the first substrate-processing apparatus 300. The substrate-processing unit 312 has the same configuration as that of the electrode-forming portion 92 and the light-emitting layer-forming portion 93 of the substrate-processing apparatus 100 according to the first embodiment.

In the second substrate-processing apparatus 310, the above-described substrate cartridge 1 is used as the substrate-supplying unit 311 and the substrate-recovering unit 313. In addition, the substrate-recovering unit 303 (the substrate cartridge 1) that is detached from the first substrate-processing apparatus 300 and is conveyed to the second substrate-processing apparatus 310 is used as the substrate-supplying unit 311 of the second substrate-processing apparatus 310. Accordingly, the substrate cartridge 1 also serves as a relay device that relays between the first substrate-processing apparatus 300 and the second substrate-processing apparatus 310 and the sheet substrate FB.

The main control apparatus CONT is connected to both of the first substrate-processing apparatus 300 and the second substrate-processing apparatus 310 through wired or wireless communication mechanisms and is configured to control the overall operations of both of the first substrate-processing apparatus 300 and the second substrate-processing apparatus 310. In addition, the main control apparatus CONT includes the first table Tb1 and the second table Tb2 described in the first embodiment. Accordingly, the main control apparatus CONT can perform overall management of the information, which is maintained in the information-maintaining section IC of the substrate cartridge 1 used in the first substrate-processing apparatus 300 and the second substrate-processing apparatus 310.

As above, in this embodiment, since the main control apparatus CONT performs overall management of the information that is maintained in the information-maintaining section IC of the substrate cartridge 1, the information managing capability of the substrate-processing system SYS can be improved, whereby the processing efficiency of the substrate-processing system SYS is improved.

In this embodiment, in a case where the manufacturing line of the organic EL element 50 is controlled overall by the control section 104 or the main control apparatus CONT, the information-maintaining section IC of the substrate cartridge 1 may be configured to maintain only the identification information. For example, in a case where the manufacturing line of the organic EL element 50 is managed overall by the main control apparatus CONT, the main memory unit MMR (see FIG. 27) of the main control apparatus CONT includes specification information corresponding to the identification information, and the main control apparatus CONT recognizes the specification information based on the identification information of the substrate cartridge 1 and can perform a process (for example, a unit process) that is based on the specification information. As above, the main control apparatus CONT reads out the specification information corresponding to the identification information read out from the information-maintaining section IC from the main memory unit MMR and transmits a process signal to the first substrate-processing apparatus 300 or the second substrate-processing apparatus 310 so as to perform a process that is based on the specification information. The process signal, for example, is a signal instructing a set value and the like for allowing the first substrate-processing apparatus 300 and the like to perform each process. In addition, for example, in a case where the manufacturing line of the organic EL element 50 is managed overall by the control section 104, instead of the main control apparatus CONT, the control section 104 may be used. In such a case, the processing efficiency of the first substrate-processing apparatus 300 or the second substrate-processing apparatus 310 is improved.

In addition, in the first embodiment, as a connection destination of the substrate cartridge 1 detached from the first substrate-processing apparatus 300, although the second substrate-processing apparatus 310 has been described as an example, the present invention is not limited thereto. For example, it may be configured such that a plurality of processing apparatuses 320 (denoted by a dashed dotted line in FIG. 27) that perform a plurality of types of unit processes such as a coating apparatus, a deposition apparatus, and a sputtering apparatus are arranged, and each processing apparatus 320 is controlled overall by the main control apparatus CONT. In such a case, the connection destination of the substrate cartridge 1 detached from the first substrate-processing apparatus 300 can be controlled to be changed for each processing apparatus 320 by the main control apparatus CONT. Through the control, the process corresponding to the specification information of the sheet substrate FB is performed.

The technical scope of the present invention is not limited to the above-described embodiments, and appropriate changes may be made thereto in the range not departing from the concept of the present invention.

For example, a configuration may be employed in which the substrate cartridge 1 does not maintain the specification information but maintains the process ID. According to such a configuration, the information management of the substrate-processing system SYS can be performed in a simpler manner.

In addition, in the above-described embodiments, although the conversion of the process that is performed based on the specification information is performed by the control section 104 or the main control apparatus CONT, the present invention is not limited thereto, and a conversion control apparatus (or a conversion control unit) that controls the conversion of the process may be separately arranged. In such a case, a table corresponding to the first table Tb1 and the second table Tb2 is arranged in the conversion control apparatus, and the information maintained by the information-maintaining section IC of the substrate cartridge 1 is configured to be delivered to the conversion control apparatus. The conversion control apparatus selects a process based on the information stored in the table and transmits the selection result to the control section 104 or the main control apparatus CONT. In addition, such a conversion control apparatus, for example, may be arranged in the substrate cartridge 1.

In the first embodiment and the second embodiment described above, although a configuration in which the substrate cartridge 1 is used only in the substrate-supplying unit of the substrate-processing unit and a configuration in which the substrate cartridge 1 is used in both the substrate-supplying unit and the substrate-recovering unit of the substrate-processing unit have been described as an example, for example, a configuration may be employed in which the substrate cartridge 1 is used only in the substrate recovering unit.

Fourth Embodiment

Next, a fourth embodiment of the present invention will be described. In the description presented below, the same reference numerals are assigned to constituent elements that are the same as or equivalent to those of the above-described embodiment, and the description thereof will be omitted or simplified. Also in this embodiment, as illustrated in FIG. 2, the substrate-processing apparatus 100 is an apparatus that forms the organic EL element 50 shown in FIG. 1 by using a band-shaped sheet substrate FB having flexibility. As illustrated in FIG. 2, the substrate-processing apparatus 100 includes a substrate-supplying unit 101, a substrate-processing unit 102, a substrate-recovering unit 103, and a control section 104. The sheet substrate FB is configured to pass through the substrate-processing unit 102 from the substrate-supplying unit 101 and is conveyed to the substrate-recovering unit 103. The control section 104 controls the overall operation of the substrate-processing apparatus 100. In addition, the control section 104 includes a database 104DB that is a memory unit storing information.

Figure 28:
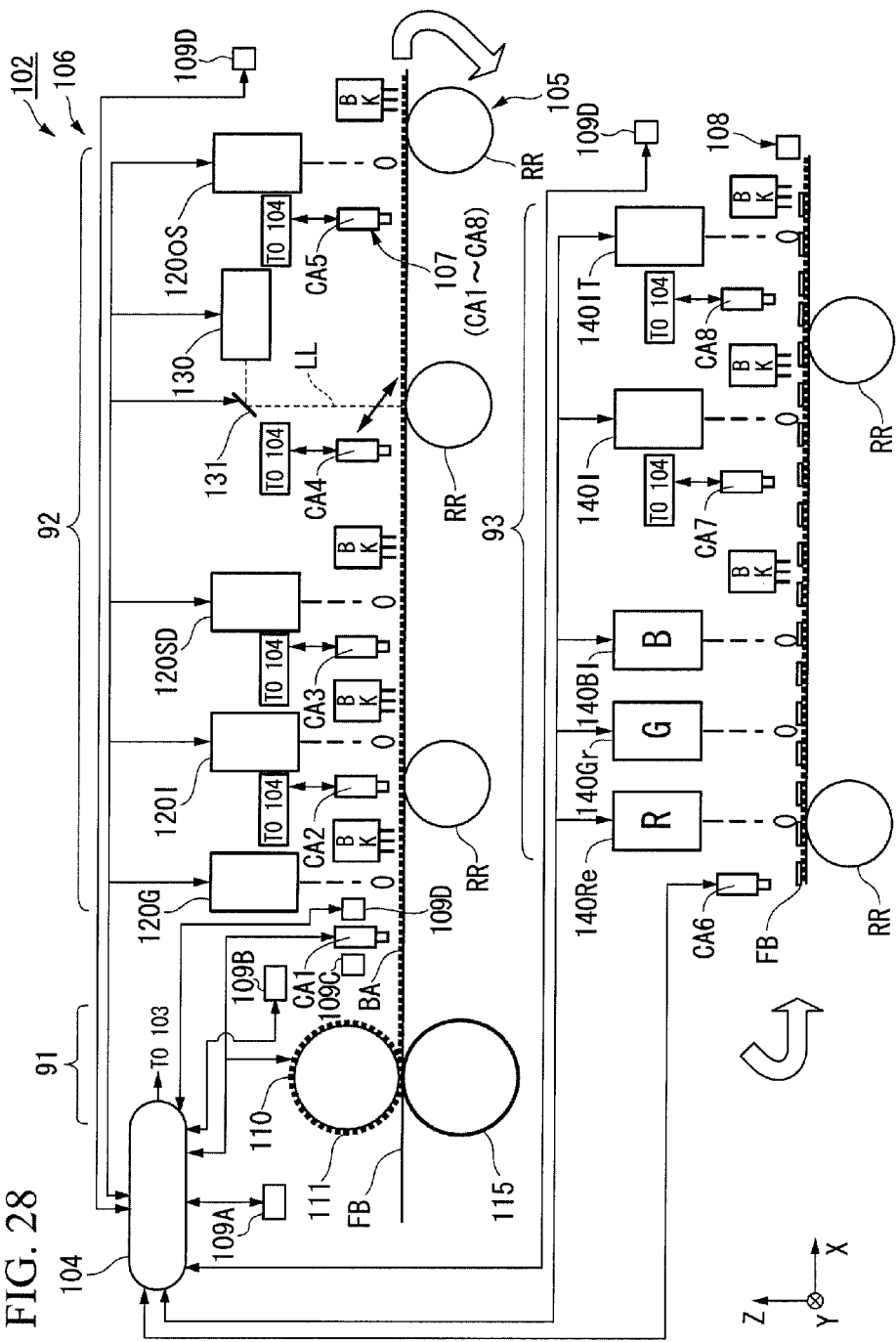
FIG. 28 is a diagram illustrating the configuration of a substrate-processing unit according to a fourth embodiment.

FIG. 28 is a diagram illustrating the configuration of the substrate-processing unit 102.

As illustrated in FIG. 28, the substrate-processing unit 102 includes a conveying section 105, an element-forming section 106, an alignment section 107, and a substrate-cutting section 108. The substrate-processing unit 102 is a portion that forms each constituent element of the above-described organic EL element 50 on the sheet substrate FB while conveying the sheet substrate FB supplied from the substrate-supplying unit 101 and sends out the sheet substrate FB on which the organic EL element 50 is formed to the substrate-recovering unit 103.

Also in this embodiment, the substrate cartridge 1 is used as the substrate-supplying unit 101 and the substrate-recovering unit 103. As illustrated in FIGS. 5 and 6, the substrate cartridge 1 includes a cartridge main body 2 and a mounting unit 3.

In the cartridge main body 2, an information-maintaining section IC is disposed (see FIG. 5). The information-maintaining section IC, for example, is configured by an IC chip (for example, a read-only type, a readable and writable type, or the like) or the like and is, for example, embedded in the cartridge main body 2. In this embodiment, the information-maintaining section IC includes a memory portion MR, for example, that stores information such as the process information of the sheet substrate FB housed in the cartridge main body 2 or identification information used for identifying the cartridge main body 2 and a communication portion CR that transmits or receives the information stored in the memory portion MR. In this embodiment, although the memory portion MR is configured to store two kinds of information including the process information and the identification information, a configuration may be employed which stores information that includes only one thereof. The communication portion CR is not limited to the configuration being disposed inside the information-maintaining section IC as in this embodiment, and, for example, the communication unit CR may be configured to be disposed independently from the information-maintaining section IC.

The process information according to this embodiment, for example, includes defect information of the sheet substrate FB. This defect information includes at least one of the positional information of the defective portion on the sheet substrate FB, the degree of defect indicating that recovery is possible or not, the kind of the defect such as a pattern loss or run-off of the pattern, a recovery state (for example, recovery or no recovery) of the defect on the sheet substrate FB, and the like. In addition, the positional information of the defective portion on the sheet substrate FB, for example, may be positional coordinates of the defective portion on the sheet substrate FB or a distance from the end portion of the sheet substrate FB to the defective portion.

The above-described defect information on the sheet substrate FB is delivered from the information-maintaining section IC to the control section 104 of the substrate-processing unit 102 through the communication portion CR. The control section 104 to which the defect information is delivered controls each process of the electrode-forming portion 92 or the like based on the defect information. For example, in a case where it is determined that the defective portion cannot be recovered based on the degree of the defect that is included in the defect information, the control section 104 delivers information indicating that an electrode-forming process is not performed for the defective portion or the element-forming area 60 including the defective portion to the liquid droplet-coating apparatus 120 together with the positional information of the defective portion. As another example, in a case where the recovery of the defective portion included in the defect information is completed, the control section 104 delivers information indicating that the electrode-forming process is performed for the defective portion of the element-forming area 60 including the defective portion to the liquid droplet-coating apparatus 120. As above, the control section 104 can select a process for the defective portion based on the above-described defect information and can deliver the selected process to the liquid droplet-coating apparatus 120 and the like in advance.

Figure 29A:
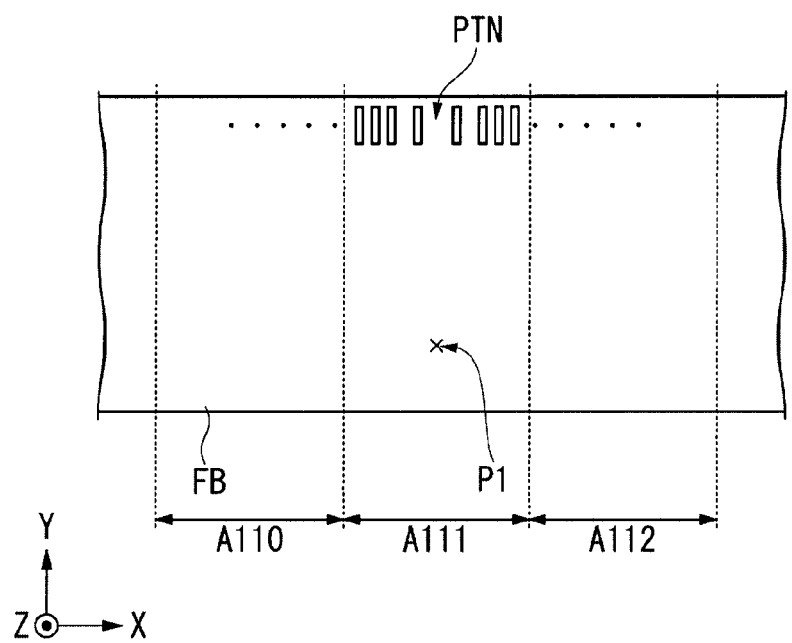
FIG. 29A is a diagram illustrating a partial configuration of a sheet substrate according to the embodiment.

In addition, as illustrated in FIG. 29A, it may be configured such that, for example, patterns PTN such as marks that become reference positions are formed along the X direction at positions along an end side of the sheet substrate FB in the Y direction, the position of a defective portion P1 is detected by using the patterns PTN, and the detection result is set as the positional information of the defective portion P1. In the example illustrated in FIG. 29A, an encoder pattern of an encoder (positional information-detecting apparatus) is formed on the sheet substrate FB as the pattern PTN. The encoder pattern, for example, is a pattern that can be used for determining the position in the X direction on the sheet substrate FB. Even in a case where the positional information of the defective portion P1 is a position in the X direction on the sheet substrate FB, the positional coordinates of the defective portion P1 can be specified by detecting the position of the defective portion P1 in the Y direction by using a line sensor arranged in the Y direction or a camera that can be moved in the Y direction, or the like based on the position of the defective portion P1 in the X direction.

In addition, as illustrated in FIG. 29A, the positional information of the defective portion P1 may be an area number (for example, A110, A111, A112, or the like) that is assigned to each area (for example, a defective area) acquired by breaking the sheet substrate FB into a plurality of areas along the X direction.

In addition, the process information according to this embodiment includes positional information of a predetermined portion on the sheet substrate FB, the progress information of the process for the sheet substrate FB, the form information of formed layers (for example, each electrode layer, a TFT layer, a light-emitting layer, and the like) formed in the sheet substrate FB, the shape information on the shape of the sheet substrate FB, and the like. Here, as examples of the predetermined portion on the sheet substrate, there are the above-described defective portion, a portion in which the reference mark for positioning is formed, a portion in which a reference mark that becomes an index of the length or the interval of the sheet substrate FB, and the like. In addition, in a case where the sheet substrate FB is formed by connecting a plurality of unit substrates, the process information includes information of the connection position (the position of a joint) between the unit substrates.

The progress information includes information that indicates a step to which the process progresses for the sheet substrate FB and the like. The progress information, for example, is information that represents the step of the process such as a step in which only the partition walls BA are formed on the sheet substrate FB, a step in which the partition walls and the electrodes are formed on the sheet substrate FB, a step in which the partition walls, the electrodes, and the light-emitting layer are formed on the sheet substrate FB, and the like. In addition, the progress information may include steps in which a pretreatment (for example, a lyophilic treatment, a liquid-repellent treatment, a protective film-forming process, and the like) is performed for the sheet substrate FB and may include the steps in which electrodes such as the gate electrode, the source electrode, the drain electrode, and the like are formed. This progress information is delivered to the control section 104 of the substrate-processing unit 102 from the information-maintaining section IC through the communication portion CR and is used as one type of information for selecting a process to be performed for the sheet substrate FB by the substrate-processing unit 102.

The form information includes information such as the shape of a formed layer (for example, the electrode layer or the light-emitting layer) formed on the sheet substrate FB, a positional deviation of the formed layer, the size (for example, the magnitude, the layer thickness, or the like) of the formed layer, the formed range of the formed layer, or the position of the formed layer. This form information is delivered to the control section 104 of the substrate-processing unit 102 from the information-maintaining section IC through the communication portion CR. For example, such form information is used as one type of information used for setting the start portion of the process in a case where the process for the sheet substrate FB is stopped in the middle due to the apparatus system being down or maintenance of the apparatus being required. In addition, for example, the positional deviation of the formed layer as the above-described form information is used as one type of information used for notifying of a maintenance period or an abnormality of the apparatus based on information of the number or the ratio of the positional deviations in the sheet substrate FB.

In addition, the shape information includes information on the shape of the whole sheet substrate FB. For example, in a case where a part of the sheet substrate FB is notched or an opening portion is configured to be included in a part of the sheet substrate FB, the shape information includes information on the notch or the opening portion (for example, the kind or the positional information of the shape). This shape information is delivered to the control section 104 of the substrate-processing unit 102 from the information-maintaining section IC through the communication portion CR. For example, such shape information is used for acquiring the abrasion frequency or the degree of damage of the sheet substrate FB that is caused by the conveying portion 21, and the control section 104 outputs the information that indicates the maintenance period of the apparatus or the abnormality of the apparatus based on the shape information.

In addition, the information-maintaining section IC, for example, is electrically connected to the above-described terminal 3c. The terminal 3c is configured to be connected to the apparatus-side terminal 102C (see FIG. 2) disposed in the supply-side connection portion 102A of the substrate-processing unit 102 when the substrate cartridge 1 is connected to the substrate-processing unit 102. In such a case, the information-maintaining section IC is electrically connected to the substrate-processing unit 102 through the terminal 3c and can exchange information with the substrate-processing unit 102 through the terminal 3c. In addition, the information-maintaining section IC can communicate with the communication portion 104CR (see FIG. 2) disposed in the control section 104 of the substrate-processing apparatus 100 for information through the communication portion CR. In such a case, the exchange of information between the substrate cartridge 1 and the substrate-processing unit 102 is controlled by the control section 104.

In the memory portion MR of the information-maintaining section IC, in addition to the above-described information, for example, a variety of reference information such as information of the tact or the throughput of the substrate-processing apparatus 100, information of the conveying speed of the substrate cartridge 1 and the winding-up/sending-out speed of the roller portion 26, or information on the sheet substrate FB may be maintained. Here, the term "tact" represents the processing time per unit processing area (for example, the area that can be processed at once by the liquid droplet-coating apparatuses 120 and 140, and the like, the screen area or the panel entire-face area of the organic EL element 50 per one panel). In addition, the term "throughput" represents the amount (for example, the length, the number of panels, the number of substrate cartridges 1) of the sheet substrate FB that can be processed per unit time. Such reference information, similarly to the identification information, the process information, and the like, is configured to be delivered to the control section 104 through the communication portion CR.

In addition, in this embodiment, for example, a formation apparatus 109A that forms the pattern PTN on the sheet substrate FB, a detection apparatus 109B that detects the pattern PTN, a cutting removal apparatus 109C that cuts out a part of the sheet substrate FB so as to be removed, an abnormality-detecting apparatus 109D that detects an abnormality including defect information on the sheet substrate FB, and the like are disposed in the substrate-processing unit 102 (see FIG. 28).

In the embodiment illustrated in FIG. 28, in a case where a defective portion or the like on the sheet substrate FB is detected by the abnormality-detecting apparatus 109D, the positional information of the defective portion can be detected by the detection apparatus 109B. For example, the positional information of the detected defective portion is delivered to the information-maintaining section IC of the substrate-recovering unit 103 (the substrate cartridge 1) by the control section 104 as defective information of the sheet substrate FB.

Figure 29B:
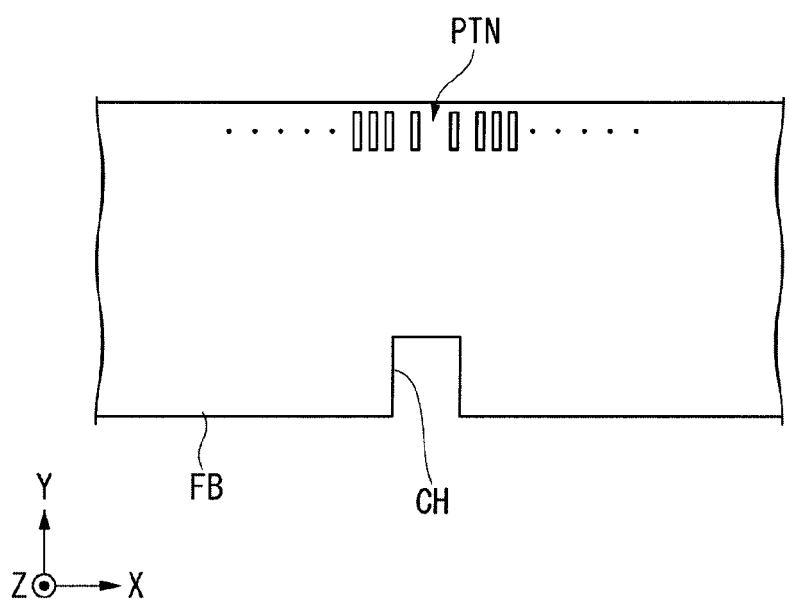
FIG. 29B is a diagram illustrating a partial configuration of the sheet substrate according to the embodiment.

In addition, in the embodiment illustrated in FIG. 28, in a case where defect information is stored in the information-maintaining section IC of the substrate-supplying unit 102, the defective portion included in the defect information is cut out and removed by the cutting removal apparatus 109C based on the positional information of the defective portion. In such a case, for example, as illustrated in FIG. 29B, a notch portion CH is formed in a part of the sheet substrate FB.

(Operation of Substrate-Processing Apparatus)

Next, the operation of the substrate-processing apparatus 100 configured as described above will be described.

Also in this embodiment, a connection operation of connecting the substrate cartridge 1 housing the sheet substrate FB as the substrate-supplying unit 101 to the supply-side connection portion 102A, a sheet substrate FB-supplying operation performed through the substrate cartridge 1 by using the substrate-supplying unit 101, an element-forming operation by using the substrate-processing unit 102, and an operation of detaching the substrate cartridge 1 are sequentially performed.

First, a connection operation of the substrate cartridge 1 will be described. As illustrated in FIG. 10, in the supply-side connection portion 102A, an insertion opening is formed in a shape corresponding to the mounting unit 3.

In the connection operation, positioning of the mounting unit 3 and the supply-side connection portion 102A is performed in the state in which the substrate cartridge 1 is held by the holder (for example, the same configuration as that of the holder HD illustrated in FIGS. 8 and 9). After the positioning is performed, the mounting unit 3 is moved to the +X side so as to be inserted into the substrate-processing unit 102.

At this time, the terminal 3C of the mounting unit 3 and the apparatus-side terminal 102C of the supply-side connection portion 102A are brought into contact with each other. By bringing the terminal 3C and the apparatus-side terminal 102C into contact with each other, information is transmitted and received between the information-maintaining section IC of the substrate cartridge 1 and the control section 104. In accordance with the communication operation, the process information or the reference information maintained in the information-maintaining section IC is delivered to the control section 104. In addition, before the connection operation of the substrate cartridge 1, the information-maintaining section IC may deliver the above-described information to the control section 104 through wireless communication performed between the communication portion CR of the information-maintaining section IC and the communication portion 104CR of the control section 104.

Next, the supply operation will be described. In order to supply the sheet substrate FB to the substrate-processing unit 102, for example, the rotation shaft member 26*a* (the roller portion 26) of the substrate cartridge 1 and the tension roller 21*a* are rotated in a direction opposite to that at the time of the housing operation. As illustrated in FIG. 11, the sheet substrate FB is sent out through the opening portion 34.

Next, the element-forming operation will be described. In the element-forming operation, as illustrated in FIG. 2, elements are formed on the sheet substrate FB by the substrate-processing unit 102 while the sheet substrate FB is supplied from the substrate-supplying unit 101 to the substrate-processing unit 102. In the substrate-processing unit 102, as illustrated in FIG. 28, the sheet substrate FB is conveyed by the roller RR.

The control section 104 may control the operation of the substrate-processing unit 102 based on the reference information that is supplied from the substrate cartridge 1. For example, the control section 104 may adjust the rotation speed of each roller RR located inside the substrate-processing unit 102 in accordance with the supply speed of the sheet substrate FB supplied from the substrate cartridge 1. In addition, the control section 104 detects whether or not the roller RR is deviated in the Y axis direction and corrects the position by moving the roller RR in a case where there is a deviation. Furthermore, the control section 104 additionally performs the correction of the position of the sheet substrate FB.

The sheet substrate FB supplied from the substrate-supplying unit 101 to the substrate-processing unit 102, first, is conveyed to the partition wall-forming portion 91. In the partition wall-forming portion 91, the sheet substrate FB is pressed while being interposed between the imprint roller 110 and the thermal transfer roller 115, and partition walls BA and alignment marks AM are formed on the sheet substrate through heat transfer.

Next, the detachment operation will be described. For example, after the organic EL element 50 is formed on the sheet substrate FB, and the sheet substrate FB is recovered, the substrate cartridge 1 used as the substrate-supplying unit 101 is detached from the substrate-processing unit 102.

Before each operation described above is performed, the control section 104 can perform the process by using the information delivered from the substrate cartridge 1. For example, the control section 104 may determine the processing state of the sheet substrate FB in accordance with the process information read out from the information-maintaining section IC of the substrate cartridge 1 (the substrate-supplying unit 101) and perform each operation (the supply operation, the element-forming operation, and the like) in correspondence with the processing state. For example, the control section 104 determines the necessity/non-necessity of recovery of the defective portion of the sheet substrate FB, element formation/non-element formation in the area including the defective portion of the sheet substrate FB, the necessity/non-necessity of cutting-off of the defective portion of the sheet substrate FB by using the cutting removal apparatus 109C, and the like based on the defect information read out from the information-maintaining section IC of the substrate-supplying unit 101. In a case where it is determined that the defective portion of the sheet substrate FB cannot be recovered, the control section 104 may perform control such that the process is not performed for the defective portion. Accordingly, the substrate-processing apparatus 100 can reduce the cost (for example, the amount of a material, the coating time of the material, or the like) required for each process. On the other hand, in a case where the defective portion of the sheet substrate FB is recoverable, the control section 104 may perform control such that a process recovering the defective portion out of the partition wall forming operation, the electrode forming operation, and the light-emitting layer forming operation. In addition, the control section 104 may perform control so as to perform a process of storing recovery history relating to the recovery of the defective portion, which has been processed by the substrate-processing unit 102, in the information-maintaining section IC of the substrate-recovering unit 103 as the process information. Here, the recovery history includes the type of defect, success/failure of recovery of the defective portion, the content of recovery that indicates the type of recovery (for example, a recovery method or a recovery order), recovery date and time, and the like. The control section 104 performs control such that the defective portion is recovered based on the recovery history when the defective portion is to be recovered. For example, the control section 104 sets a recovery content that is optimal to the defective portion to be recovered based on a combination of the type of defect, a success/failure of recovery, and the recovery content.

In addition, the control section 104 may perform control such that a pattern identifiable from the other portions is directly formed, for example, by using the liquid droplet-coating apparatus 120, the liquid droplet-coating apparatus 140, or the like in a portion (for example, a defective portion) in which an abnormality has been detected in a part of the sheet substrate FB or a portion in which an abnormality has been determined based on the information transmitted from the substrate cartridge 1. In such a case, the abnormality-detecting apparatus 109D needs to detect only the pattern, and accordingly, the detection precision is improved.

In addition, when each operation described above is performed, in a case where a defective portion is detected in a part of the sheet substrate FB by the abnormality-detecting apparatus 109D disposed on the upstream side of the substrate-processing unit 102 illustrated in FIG. 28, the control section 104 delivers the defect information relating to the defective portion to the information-maintaining section IC of the substrate-recovering unit 103. Accordingly, the control section 104 can store the process information such as the defect information acquired in the process of each operation described above in the information-maintaining section IC of the substrate-recovering unit 103. As above, the control section 104 can store the process information acquired through each process by the substrate-processing unit 102 in the substrate-recovering unit 103. In addition, the process information stored in the substrate-recovering unit 103 is used as the above-described information in the next manufacturing line or the like.

In addition, before each operation described above is performed, in a case where it is determined that the partition walls BA have been already formed on the sheet substrate FB by the control section 104 based on the process information read out from the information-maintaining section IC of the substrate-supplying unit 101, the control section 104 can omit the partition wall-forming operation and perform the next electrode-forming operation. Then, the control section 104 updates the processing order in which the partition wall-forming operation is omitted, and the next electrode-forming operation is performed as described above in the information-maintaining section IC of the substrate-recovering unit 103 as the process information.

Furthermore, after each operation described above is performed, the control section 104 may deliver the process information of the substrate-supplying unit 101 to the substrate-recovering unit 103. In such a case, since the control section 104 delivers the process information based on each process performed for the sheet substrate FB by the substrate-processing unit 102 and the process information of the substrate-supplying unit 101 to the substrate-recovering unit 103, the substrate-recovering unit 103 can maintain the process progress information such as the processes performed for the sheet substrate FB as the process information.

In addition, in a case where the sheet substrate FB is cut off by the substrate-cutting section 108, by cutting the sheet substrate FB while avoiding a portion in which a defect or notch is formed, the substrate-cutting section 108 can efficiently remove the portion in which the defect or the notch is formed. Out of the removed portions, a portion that can be used as an element can be separately reused.

Next, the detachment operation will be described. For example, after the organic EL element 50 is formed on the sheet substrate FB, and the sheet substrate FB is recovered, the substrate cartridge 1 used as the substrate-supplying unit 101 is detached from the substrate-processing unit 102.

FIG. 22 is a diagram illustrating the operation of detaching the substrate cartridge 1.

As illustrated in FIG. 22, in the detachment operation, the mounting unit 3 is moved in the −X direction so as to be excluded from the supply-side connection portion 102A, the mounting unit 3 is excluded. In this operation, the mounting unit 3 is deviated along the guidance of the supply-side connecting portion 102A.

In addition, according to this embodiment, the substrate cartridge 1 includes the cartridge main body 2 that houses the sheet substrate FB and the information-maintaining section IC that maintains at least one of the identification information used for identifying the cartridge main body 2 and the process information of the sheet substrate FB housed in the cartridge main body 2, and accordingly, the substrate-processing unit 102 can perform an appropriate process on the sheet substrate FB based on the identification information or the process information.

Furthermore, according to this embodiment, the substrate-processing apparatus 100 includes the substrate-processing unit 102 that processes the sheet substrate FB, the substrate-supplying unit 101 that carries the sheet substrate FB in the substrate-processing unit 102, and the substrate-recovering unit 103 that carries the substrate out from the substrate-processing unit 102, and the substrate cartridge 1 is used as the substrate-supplying unit 101, whereby the substrate-processing unit 102 can perform an optimal process on the sheet substrate FB by using the information supplied from the substrate cartridge 1. Accordingly, the process for the sheet substrate FB that is performed by the substrate-processing unit 102 can be efficiently performed.

In addition, according to this embodiment, in the manufacturing process of the display element, a process of processing the sheet substrate FB by using the substrate-processing unit 102 and a process of supplying the sheet substrate FB to the substrate-processing unit 102 or recovering the sheet substrate FB from the substrate-processing unit 102 by using the substrate cartridge 1 are included, whereby the display element can be efficiently manufactured using the managing information at a high level.

Furthermore, according to this embodiment, for example, the control section 104 can update information such as the process information that is maintained in the information-maintaining section IC of the substrate cartridge 1, whereby the substrate cartridge 1 used as the substrate-supplying unit 101 can be recycled.

Fifth Embodiment

Next, a fifth embodiment of the present invention will be described.

In this embodiment, the above-described substrate cartridge 1 is used in each of the substrate-supplying unit 201 and the substrate-recovering unit 203, which is different from the fourth embodiment. Also in this embodiment, as illustrated in FIG. 23, the substrate-processing apparatus 200 includes a substrate-supplying unit 201, a substrate-processing unit 202, a substrate-recovering unit 203, and a control unit 204.

The substrate-processing unit 202 has a configuration in which, for example, the substrate-cutting section 108 is not disposed in the substrate-processing unit 102 according to the fourth embodiment. Accordingly, the sheet substrate FB processed by the substrate-processing unit 202 is recovered by the substrate-recovering unit 203 in the state of being maintained in a sheet shape without being cut.

In addition, for example, the configuration in which the identification information and the process information of the sheet substrate FB is maintained, the configuration in which the information-maintaining section IC and the control unit 204 can communicate with each other, and the like are similar to the configurations described in the fourth embodiment.

In the recovery operation, as illustrated in FIG. 24, the sheet substrate FB is inserted into the opening portion 34 of the substrate cartridge 1, and the protective substrate PB is inserted from the second opening portion 35. The protective substrate PB, for example, is supplied from the protective substrate-supplying unit not illustrated in the figure.

The sheet substrate FB and the protective substrate PB that have been inserted, as illustrated in FIG. 25, are guided by the substrate-guiding portion 22 and the second substrate-guiding portion 37 respectively, thereby joining together in the joining portion 39. The sheet substrate FB and the protective substrate PB joined in the joining portion 39, as illustrated in FIG. 26, are conveyed by the conveying portion 21 in the state of being joined and are pressed by the tension roller 21a and the measurement roller 21b so as to be brought into tight contact with each other. The sheet substrate FB and the protective substrate PB are wound up by the roller portion 26 so as to be recovered in a tight contact state.

When the sheet substrate FB is recovered by the substrate-recovering unit 203, the control unit 204 transmits the process information of the sheet substrate FB after processing to the information-maintaining section IC of the substrate cartridge 1 used as the substrate-recovering unit 203. The information-maintaining section IC receives the transmitted information and stores the transmitted information in the memory portion MR.

As above, according to this embodiment, the substrate-processing apparatus 200 includes the substrate-processing unit 202 that processes the sheet substrate FB, the substrate-supplying unit 201 that carries the sheet substrate FB in the substrate-processing unit 202, and the substrate-recovering unit 203 that carries the substrate out from the substrate-processing unit 202, and the substrate cartridge 1 is used as the substrate-supplying unit 201 and the substrate-recovering unit 203, whereby the process information transmitted from the substrate cartridge 1 is delivered to the substrate cartridge 1 of the recovery destination. Accordingly, even in a case where the substrate cartridge 1 of the recovery destination is managed, or the sheet substrate FB housed in the substrate cartridge 1 of the recovery destination is processed, the substrate-processing apparatus 200 can use the above-described information. Therefore, the information managing capability of the substrate-processing apparatus 200 can be improved, whereby the processing efficiency is markedly improved.

In this embodiment, although an example has been described in which the configuration of the substrate-processing unit 202 is the same as that of the substrate-processing unit 102 described in the fourth embodiment, the present invention is not limited thereto. For example, in the substrate-processing unit 202, a configuration may be employed in which only some of the partition wall-forming portion 91, the electrode-forming portion 92, and the light-emitting layer-forming portion 93 that configure the substrate-processing unit 102 described in the fourth embodiment are disposed.

For example, a configuration will be described as an example in which only the partition wall-forming portion 91 is disposed as the substrate-processing unit 202, but the electrode-forming portion 92 and the light-emitting layer-forming portion 93 are not disposed. In such a case, in a state in which only the partition walls BA are formed by the substrate-processing unit 202, the sheet substrate FB is recovered by the substrate-recovering unit 203. For the sheet substrate FB that is recovered by the substrate-recovering unit 203, an electrode-forming process and a light-emitting layer forming process are performed by another substrate-processing unit.

Since the substrate cartridge 1 is disposed so as to be attachable/detachable to or from the substrate-processing unit 202, in such a case, the substrate cartridge 1 can be detached from the substrate-processing unit 202, and the substrate cartridge 1 can be conveyed and connected to another substrate-processing unit. In the information-maintaining section IC of the substrate cartridge 1, the identification information of the substrate cartridge 1 and the process information of the sheet substrate FB are maintained, and accordingly, the process can be performed by the substrate-processing unit of the connection destination by using the information. As above, even in a case where a plurality of the substrate-processing units is passed over in one manufacturing line, and communication of information between the substrate-processing units is not performed, the information of the sheet substrate FB can be delivered through the substrate cartridge 1. Even in such a case, the information managing capability can be improved, whereby the processing efficiency is markedly improved.

Sixth Embodiment

Next, a sixth embodiment of the present invention will be described.

In this embodiment, a case will be described as an example in which a plurality of the substrate-processing units communicates with each other for information.

Figure 30:
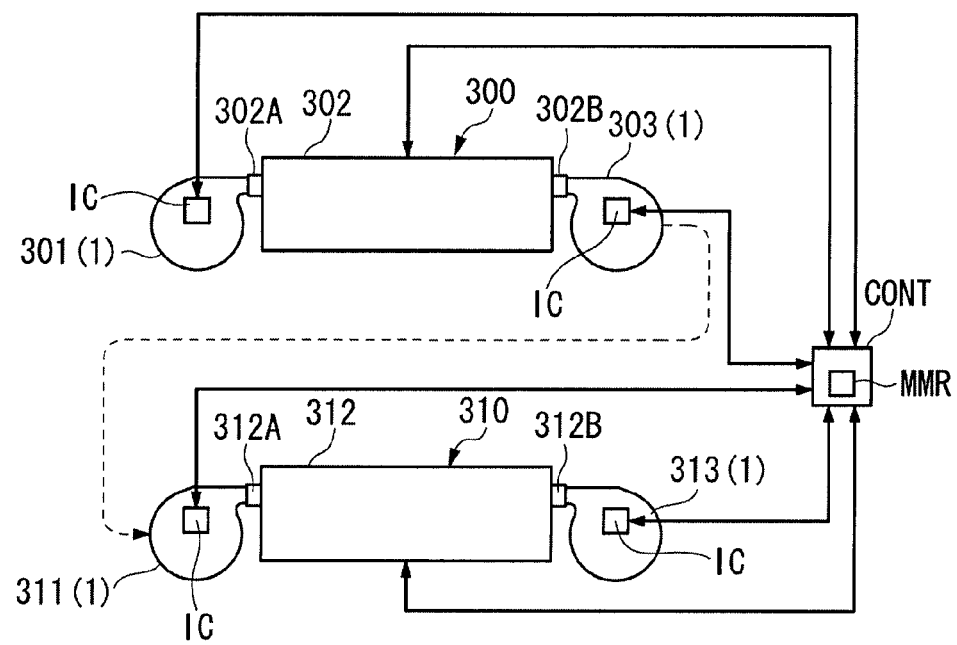
FIG. 30 is a diagram illustrating a substrate-processing system according to a sixth embodiment of the present invention.

FIG. 30 is a diagram illustrating a substrate-processing system SYS according to this embodiment.

As illustrated in FIG. 30, the substrate-processing system SYS includes a first substrate-processing apparatus 300, a second substrate-processing apparatus 310, and a main control apparatus CONT. For example, the first substrate-processing apparatus 300 and the second substrate-processing apparatus 310 are disposed within the same site or within the same factory.

The first substrate-processing apparatus 300, for example, is an apparatus that forms the partition walls BA of the organic EL element 50 on the sheet substrate FB. The second substrate-processing apparatus 310, for example, is an apparatus that forms electrodes (a gate electrode G and the like), the light-emitting layer IR of the organic EL element 50, and the transparent electrode ITO on the sheet substrate FB. As above, in the substrate-processing system SYS, the apparatus that forms the organic EL element 50 is configured to be divided into two types of apparatuses including the first substrate-processing apparatus 300 and the second substrate-processing apparatus 310.

The first substrate-processing apparatus 300 includes a substrate-supplying unit 301, a substrate-processing unit 302, and a substrate-recovering unit 303. In this embodiment, the above-described substrate cartridge 1 is used as the substrate-supplying unit 301 and the substrate-recovering unit 303.

The substrate-processing unit 302 has the same configuration as that of the partition wall-forming portion 91 of the substrate-processing apparatus 100 according to the fourth embodiment, and, in a connection portion of the substrate-processing unit 302 for the substrate-supplying unit 301, a supply-side connection portion 302A is disposed. The configuration of the supply-side connection portion 302A is the same as that of the supply-side connection portion 102A according to the fourth embodiment. As above, the first substrate-processing apparatus 300 has the same configuration as that of the substrate-supplying unit 101 of the substrate-processing apparatus 100 to the partition wall-forming portion 91 of the substrate-processing unit 102 in the fourth embodiment.

In a connection portion of the substrate-processing unit 302 for the substrate-recovering unit 303, a recovery-side connection portion 302B that is connected to the mounting unit 3 of the substrate cartridge 1 is disposed. The recovery-side connection portion 302B has the same configuration as that of the supply-side connection portion 302A.

The second substrate-processing apparatus 310 includes a substrate-supplying unit 311, a substrate-processing unit 312, and a substrate-recovering unit 313, and each unit has the same configuration as that of the first substrate-processing apparatus 300. The substrate-processing unit 312 has the same configuration as that of the electrode-forming portion 92 and the light-emitting layer-forming portion 93 of the substrate-processing apparatus 100 according to the fourth embodiment.

In the second substrate-processing apparatus 310, the above-described substrate cartridge 1 is used as the substrate-supplying unit 311 and the substrate-recovering unit 313. In addition, the substrate-recovering unit 303 (the substrate cartridge 1) that is detached from the first substrate-processing apparatus 300 and is conveyed to the second substrate-processing apparatus 310 is used as the substrate-supplying unit 311 of the second substrate-processing apparatus 310. Accordingly, the substrate cartridge 1 also serves as a relay apparatus that relays between the first substrate-processing apparatus 300 and the second substrate-processing apparatus 310 and the sheet substrate FB.

The main control apparatus CONT is connected to the first substrate-processing apparatus 300 and the second substrate-processing apparatus 310 through wired or wireless communication mechanisms and is configured to control the overall operations of the first substrate-processing apparatus 300 and the second substrate-processing apparatus 310. Accordingly, the main control apparatus CONT can perform overall management of the information, which is maintained in the information-maintaining section IC of the substrate cartridge 1 used in the first substrate-processing apparatus 300 and the second substrate-processing apparatus 310.

As above, in this embodiment, since the main control apparatus CONT performs overall management of the information that is maintained in the information-maintaining section IC of the substrate cartridge 1, the information managing capability of the substrate-processing system SYS can be improved, whereby the processing efficiency of the substrate-processing system SYS is markedly improved.

For example, as in this embodiment, in a case where the manufacturing line of the organic EL element 50 is controlled overall by the control section 104 or the main control apparatus CONT, the information-maintaining section IC of the substrate cartridge 1 may be configured to maintain only the identification information. In a case where the manufacturing line of the organic EL element 50 is managed overall by the main control apparatus CONT, for example, the main memory unit MMR (see FIG. 27) of the main control apparatus CONT includes process information corresponding to the identification information, and the main control apparatus CONT recognizes the process information based on the process information of the substrate cartridge 1 and can perform a process that is based on the process information. As a specific example, in a case where defect information of the sheet substrate FB is included in the process information as illustrated in FIG. 28, the main control apparatus CONT reads out the defect information corresponding to the identification information read out from the information-maintaining section IC from the main memory unit MMR and transmits the process signal to the first substrate-processing apparatus 300 or the second substrate-processing apparatus 310 so as to perform a process (for example, recovery of a defective portion) based on the defect information. The process signal, for example, is a signal instructing a set value and the like for allowing the first substrate-processing apparatus 300 and the like to perform each process. In addition, for example, in a case where the manufacturing line of the organic EL element 50 is managed overall by the control section 104, instead of the main control apparatus CONT, the control section 104 may be used. In such a case, the processing efficiency of the first substrate-processing apparatus 300 or the second substrate-processing apparatus 310 is improved.

The technical scope of the present invention is not limited to the above-described embodiments, and appropriate changes may be made thereto in the range not departing from the concept of the present invention.

For example, the formation apparatus 109A, the detection apparatus 109B, the cutting removal apparatus 109C, and the abnormality-detecting apparatus 109D according to the fourth embodiment, which are illustrated in FIG. 28, are merely examples, and an arrangement other than the arrangement illustrated in FIG. 3 may be employed, and some of the apparatuses may not be configured.

For example, in a case where the cutting removal apparatus 109C is not disposed, the substrate-processing unit 102 may be configured to remove a part of the sheet substrate FB by using the substrate-cutting section 108. In addition, a plurality of each of the formation apparatuses 109A, the detection apparatuses 109Bs, and the cutting removal apparatuses 109C may be arranged. The abnormality-detecting apparatus 109D is not limited to be configured on the downstream side of the partition wall-forming portion 91, the electrode-forming portion 92, and the light-emitting layer-forming portion 93 but may be omitted, or the number thereof may be increased.

In addition, the above-described pattern PTN and the like may be formed on the sheet substrate FB, for example, by using the imprint roller 110 or the thermal transfer roller 115 of the partition wall-forming portion 91, the liquid droplet-coating apparatus 120 of the electrode-forming portion 92, the liquid droplet-coating apparatus 140 of the light-emitting layer-forming portion 93, and the like. Furthermore, the pattern PTN may be formed in advance on the sheet substrate FB.

In addition, in the description presented above, the configuration forming the encoder pattern that represents the position in the X direction as the pattern PTN is merely an example, and the encoder pattern may be formed in advance on the sheet substrate FB. In addition, for example, in a case where the position of the sheet substrate FB in the Y direction is detected, the substrate-processing apparatus 102, for example, may be configured to detect the position in the Y direction by using a measurement apparatus or the like that measures the end side of the sheet substrate FB in the Y direction or a distance (distance in the Y direction) from the pattern PTN. Furthermore, a configuration may be employed in which a detection apparatus that detects the positional coordinates of the grid state in the XY direction set by the sheet substrate FB is additionally arranged in the substrate-processing unit 102.

Furthermore, in the fourth embodiment and the fifth embodiment, although the configuration in which the substrate cartridge 1 is used only in the substrate-supplying unit of the substrate-processing unit and the configuration in which the substrate cartridge 1 is used in both the substrate-supplying unit of the substrate-processing unit and the substrate-recovering unit have been described as examples, for example, a configuration may be employed in which the substrate cartridge 1 is used only in the substrate recovering unit.

What is claimed is:

1. A substrate-processing system comprising:
   a substrate-processing apparatus that processes a flexible band-shaped substrate;
   a substrate cartridge connected to the substrate-processing apparatus and comprising:
     a cartridge main body that houses the substrate; and
     an information-maintaining section that maintains information comprising at least specification information relating to a specification value of the substrate that is housed in the cartridge main body; and
   a main control unit that receives the information from the information-maintaining section of the substrate cartridge and controls the substrate-processing apparatus based on the information.

2. The substrate-processing system according to claim 1, wherein the information-maintaining section maintains process information that is based on the specification information.

3. The substrate-processing system according to claim 1, wherein
   the information-maintaining section that maintains information further comprising at least process information that is based on specification information relating to the specification value of the substrate that is housed in the cartridge main body.

4. The substrate-processing system according to claim 1, wherein the specification value comprises at least one of a material, flexibility, heat-resistance, an abrasion property, elasticity, a thickness, an expansion coefficient, a friction coefficient, and tension-resistance of the substrate.

5. The substrate-processing system according to claim 1, wherein the specification value comprises at least one of a lyophilic property for a predetermined liquid adhering to the substrate and a drying property of the predetermined liquid on the substrate.

6. The substrate-processing system according to claim 1, wherein the specification information comprises pretreatment information relating to a pretreatment performed for the substrate.

7. The substrate-processing system according to claim 1, wherein the information comprises identification information that is used for identifying the cartridge main body.

8. The substrate-processing system according to claim 1, wherein the information-maintaining section is disposed at a plurality of positions.

9. The substrate-processing system according to claim 1, wherein the information-maintaining section is disposed so as to be detachable from the cartridge main body.

10. The substrate-processing system according to claim 1, further comprising a communication unit that is connected to the information-maintaining section and performs at least one of transmission or reception of the information.

11. The substrate-processing system according to claim 1, wherein the cartridge main body further comprises a mounting unit that is connected to the substrate-processing apparatus, which processes the substrate, in an attachable/detachable manner.

12. The substrate-processing system according to claim 11, wherein the mounting unit further comprises a guiding target portion that is guided by a part of the substrate-processing apparatus.

13. The substrate-processing system according to claim 11, wherein the mounting unit further comprises a terminal portion that electrically connects the substrate-processing apparatus and the information-maintaining section.

14. The substrate-processing system according to claim 1, wherein the cartridge main body further comprises a substrate-driving mechanism that performs at least one of drawing-in of the substrate or sending-out of the substrate based on the specification information.

15. The substrate-processing system according to claim 1, wherein the information-maintaining section further comprises a display portion that displays the information.

16. The substrate-processing system according to claim 1 wherein the substrate-processing apparatus further comprises:
  a substrate-processing unit that processes the substrate;
  a substrate carrying-in unit that carries the substrate in the substrate-processing unit; and
  a substrate carrying-out unit that carries the substrate out from the substrate-processing unit,
  wherein the substrate cartridge is used as at least one of the substrate carrying-in unit or the substrate carrying-out unit.

17. The substrate-processing system according to claim 16, wherein the information maintained in the information-maintaining section of the substrate cartridge is used in the process of the substrate-processing unit.

18. The substrate-processing system according to claim 16,
  wherein the process comprises at least one unit process corresponding to the specification information of the substrate, and
  wherein the substrate-processing unit changes the unit process in accordance with the information.

19. The substrate-processing system according to claim 16, wherein the process comprises at least one unit process corresponding to the specification information of the substrate.

20. The substrate-processing system according to claim 16, further comprising an apparatus-side terminal portion that is electrically connected with the substrate cartridge.

21. The substrate-processing system according to claim 16, wherein the substrate-processing unit comprises an apparatus-side communication section that performs at least one of transmission or reception of the information to or from the substrate cartridge.

22. The substrate-processing system according to claim 1, wherein a process of the substrate-processing apparatus comprises at least one unit process corresponding to the specification information of the substrate.

23. The substrate-processing system according to claim 22, wherein the main control apparatus changes the unit process in the substrate-processing apparatus in correspondence with the information of the substrate.

24. A substrate-processing system comprising:
  a substrate-processing apparatus that processes a flexible band-shaped substrate;
  a substrate cartridge connected to the substrate-processing apparatus and comprising:
    a cartridge main body that houses the substrate; and
    an information-maintaining section that maintains at least one of identification information used for identifying the cartridge main body or process information of the substrate that is housed in the cartridge main body; and
  a main control unit that receives the information from the information-maintaining section of the substrate cartridge and controls the substrate-processing apparatus based on the information.

25. The substrate-processing system according to claim 24, wherein the process information further comprises defect information of the substrate.

26. The substrate-processing system according to claim 24,
  wherein the process information further comprises positional information of a predetermined portion of the substrate.

27. The substrate-processing system according to claim 26, wherein the predetermined portion comprises a defective portion of the substrate.

28. The substrate-processing system according to claim 27, wherein the process information further comprises defect history of the defective portion.

29. The substrate-processing system according to claim 26, wherein the positional information comprises a distance between an end portion of the substrate and the predetermined portion.

30. The substrate-processing system according to claim 26, wherein the positional information comprises a distance between a mark positioned on the substrate and the predetermined portion.

31. The substrate-processing system according to claim 24,
  wherein the process information comprises progress information of a predetermined process for the substrate.

32. The substrate-processing system according to claim 24,
  wherein the process information comprises form information of a formation layer that is formed in the substrate.

33. The substrate-processing system according to claim 24,
  wherein the process information comprises shape information on a shape of the substrate.

34. The substrate-processing system according to claim 24,
  wherein the substrate is formed by connecting a plurality of unit substrates, and
  wherein the process information comprises information on positions of connection portions of the unit substrates.

35. The substrate-processing system according to claim 24,
  wherein at least a part of the process information is formed in the substrate.

36. The substrate-processing system according to claim 24, wherein the information-maintaining section is disposed so as to be detachable from the cartridge main body.

37. The substrate-processing system according to claim 24, wherein the information-maintaining section is disposed at a plurality of positions.

38. The substrate-processing system according to claim 24, further comprising a communication unit that is connected to the information-maintaining section and performs at least one of transmission or reception of the information.

39. The substrate-processing system according to claim 24, wherein the communication unit receives the process information corresponding to the identification information.

40. The substrate-processing system according to claim 24, wherein the cartridge main body further comprises a mounting unit that is connected to a substrate-processing apparatus, which processes the substrate, in an attachable/detachable manner.

41. The substrate-processing system according to claim 40, wherein the mounting unit comprises a guiding target portion that is guided by a part of the substrate-processing apparatus.

42. The substrate-processing system according to claim 40, wherein the mounting unit comprises a terminal portion that electrically connects the substrate-processing apparatus and the information-maintaining section.

43. The substrate-processing system according to claim 24, wherein the cartridge main body comprises a substrate-driving mechanism that performs at least one of drawing-in of the substrate or sending-out of the substrate.

44. The substrate-processing system according to claim 24, wherein the information-maintaining section comprises a display portion that displays the information.

45. The substrate-processing system according to claim 24, wherein the information-maintaining section comprises the process information in correspondence with the identification information.

46. The substrate-processing system according to claim 24 wherein the substrate-processing apparatus further comprises:
a substrate-processing unit that processes a substrate;
a substrate carrying-in unit that carries the substrate in the substrate-processing unit; and
a substrate carrying-out unit that carries the substrate out from the substrate-processing unit.

47. The substrate-processing system according to claim 46, wherein the information maintained in the information-maintaining section of the substrate cartridge is used in the process of the substrate-processing unit.

48. The substrate-processing system according to claim 46, wherein the substrate-processing apparatus further comprises an apparatus-side terminal portion that is electrically connected with the substrate cartridge.

49. The substrate-processing system according to claim 46, wherein the substrate-processing unit comprises an apparatus-side communication section that performs at least one of transmission or reception of the information to or from the substrate cartridge.

50. The substrate-processing system according to claim 46, wherein the main control unit transmits information to the information-maintaining section of the substrate cartridge.

51. The substrate-processing system according to claim 50, wherein the substrate-processing unit comprises a cutting portion that cuts the substrate, and
wherein the main control unit transmits information of a position of the substrate that is cut by the cutting portion to the information-maintaining section.

52. The substrate-processing system according to claim 50, wherein the substrate-processing unit comprises a detection portion that detects an abnormal portion of the substrate, and
wherein the main control unit sends information of a position of the substrate, which is detected by the detection portion, to the information-maintaining section.

53. The substrate-processing system according to claim 52, wherein the substrate-processing unit comprises a second detection portion that detects the information assigned to the substrate.

54. The substrate-processing system according to claim 46, further comprising an information assigning unit that assigns the information to the substrate,
wherein the information assigning unit assigns the information to the substrate in correspondence with the information maintained by the information-maintaining section.

55. A method of manufacturing an electric circuit that forms an electric circuit on a sheet substrate having a band-shape and flexibility, the method of manufacturing an electric circuit comprising:
preparing a plurality of substrate cartridges that includes a cartridge main body and an information-storage part, the cartridge main body including, (i) a shaft member configured to wind up the sheet substrate, (ii) a housing portion configured to house the sheet substrate in a state in which the sheet substrate is wound around the shaft member, (iii) a mounting part configured to detachably connect the housing portion to an outside-connecting part of a processing apparatus which is configured to form the electric circuit on the sheet substrate, (iv) an opening portion that is arranged at the mounting part and that is configured to put in and out the sheet substrate from the housing portion to the processing apparatus or from the processing apparatus to the housing portion, the information-storage part being configured to storage (i) a specification information of the sheet substrate which is housed in the cartridge main body or (ii) a process information regarding a process of the processing apparatus,
connecting a supplying-substrate cartridge to a supply-side connection portion of the processing apparatus via the mounting part, the supplying-substrate cartridge being one of the plurality of substrate cartridges which is housing an unprocessed sheet substrate for a predetermined longitudinal size and which is storing the specification information in the information-storage part,
connecting one of the plurality of substrate cartridges as a recovering-substrate cartridge to a recovery-side connection portion of the processing apparatus via the mounting part,
performing a process to form the electric circuit on the sheet substrate supplied from the supplying-substrate cartridge based on a processing condition set in the processing apparatus in accordance with the specification information stored in the information-storage part of the supplying-substrate cartridge;
housing the processed sheet substrate in the recovering-substrate cartridge, and
transmitting a process progress information performed on the sheet substrate by the processing apparatus together with the specification information stored in the information-storage part of the supplying-substrate cartridge to the information-storage part of the recovering-substrate cartridge.

56. The method of manufacturing an electric circuit according to claim 55,
wherein the electric circuit includes a thin film transistor and wiring connected to the thin film transistor.

57. The method of manufacturing an electric circuit according to claim 56,
wherein the processing apparatus is configured to control a processing condition of the sheet substrate based on the specification information stored in the information-storage part of the supplying-substrate cartridge.

58. The method of manufacturing an electric circuit according to claim 57,
wherein, when each of a heating process, a cooling process, a conveying process, a press process, a coating process, a deposition process, a sputtering process, a light-emitting process, an electronic ray-emitting process, an exposure process, a developing process, a dip treatment, a drying process, a physical processing process, a chemical processing process, a process of bonding with another substrate, a detection process, an alignment process, a deformation process, a modification process, a partition wall-forming process are set as an unit process, the processing apparatus is configured to change a condition of the unit process performed on the sheet substrate in accordance with the specification information.

59. The method of manufacturing an electric circuit according to claim 58,
wherein the specification information stored in the information-storage part of the substrate cartridge includes at least one of a material of the sheet substrate, a flexibility of the sheet substrate, a heat-resistance of the sheet substrate, an abrasion property of the sheet substrate, an elasticity of the sheet substrate, an expansion coefficient of the sheet substrate, a friction coefficient of the sheet substrate, a tension-resistance of the sheet substrate, a lyophilic property with respect to a predetermined liquid adhering to the sheet substrate, and a drying property of the predetermined liquid on the sheet substrate, as a specification value, the sheet substrate being housed in the substrate cartridge.

60. The method of manufacturing an electric circuit according to claim 59,
wherein the substrate cartridge includes:
a substrate-driving mechanism configured to perform a drawing of the sheet substrate or a sending out of the sheet substrate based on the specification information,
a roller that is arranged between the opening portion and the shaft member and that is configured to roll in accordance with a conveyance of the sheet substrate, and
a detection part configured to detect a rotation number or a rotation angle of the roller and to measure a conveyance distance of the sheet substrate.

61. A method of manufacturing an electric circuit that forms an electric circuit on a sheet substrate having a band-shape and flexibility, the method of manufacturing an electric circuit comprising:
preparing a plurality of substrate cartridges that includes a cartridge main body and an information-storage part, the cartridge main body including, (i) a shaft member configured to wind up the sheet substrate, (ii) a housing portion configured to house the sheet substrate in a state in which the sheet substrate is wound around the shaft member, (iii) a mounting part configured to detachably connect the housing portion to an outside-connecting part of a processing apparatus which is configured to form the electric circuit on the sheet substrate, (iv) an opening portion that is arranged at the mounting part and that is configured to put in and out the sheet substrate from the housing portion to the processing apparatus or from the processing apparatus to the housing portion, the information-storage part being configured to storage a process information including a positional information of a predetermined portion of the sheet substrate stored in the cartridge main body,
connecting a supplying-substrate cartridge to a supply-side connection portion of the processing apparatus via the mounting part, the supplying-substrate cartridge being one of the plurality of substrate cartridges which is housing an unprocessed sheet substrate for a predetermined longitudinal size and which is storing the process information in the information-storage part,
connecting a substrate cartridge not storing the sheet substrate as a recovering-substrate cartridge to a recovery-side connection portion of the processing apparatus via the mounting part,
performing a process to form the electric circuit on the sheet substrate supplied from the supplying-substrate cartridge under a processing condition set in the processing apparatus based on the process information stored in the information-storage part of the supplying-substrate cartridge;
housing the processed sheet substrate in the recovering-substrate cartridge, and
storing the process information stored in the information-storage part of the supplying-substrate cartridge and a process progress information performed on the sheet substrate by the processing apparatus to the information-storage part of the recovering-substrate cartridge.

62. The method of manufacturing an electric circuit according to claim 61,
wherein the sheet substrate stored in the supplying-substrate cartridge is formed by a plurality of sheet substrates connected in a band-shape direction, and
wherein the positional information of the predetermined portion stored as the process information represents a position of a connecting part of the plurality of the sheet substrates.

63. The method of manufacturing an electric circuit according to claim 61,
wherein the positional information of the predetermined portion stored as the process information represents a defective portion on the sheet substrate.

64. The method of manufacturing an electric circuit according to claim 63,
wherein the process information includes a defect history of the defective portion on the sheet substrate.

65. The method of manufacturing an electric circuit according to claim 61,
wherein the position information includes a distance between an end portion of the sheet substrate and the predetermined portion or a distance between a mark formed on the sheet substrate and the predetermined portion.

66. The method of manufacturing an electric circuit according to claim 61,
wherein the process information further includes at least one of a defect information of the sheet substrate, a process information of the process performed on the sheet substrate, a form information regarding a formation layer formed on the sheet substrate, and a shape information regarding a shape of the sheet substrate.

67. The method of manufacturing an electric circuit according to claim 61,
wherein the processing apparatus includes a detection part configured to detect an abnormal portion generated on the sheet substrate, and wherein information regarding a position on the sheet substrate of the abnormal portion detected by the detection part is sent to the information-storage part of the recovering-substrate cartridge as positional information of the predetermined portion.

* * * * *